US007846489B2

(12) United States Patent
Chang

(10) Patent No.: US 7,846,489 B2
(45) Date of Patent: Dec. 7, 2010

(54) METHOD AND APPARATUS FOR CHEMICAL DEPOSITION

(75) Inventor: Chih-hung Chang, Corvallis, OR (US)

(73) Assignee: State of Oregon acting by and though the State Board of Higher Education on behalf of Oregon State University, Corvallis, OR (US)

( * ) Notice: Subject to any disclaimer, the term of this patent is extended or adjusted under 35 U.S.C. 154(b) by 228 days.

(21) Appl. No.: 11/490,966

(22) Filed: Jul. 21, 2006

(65) Prior Publication Data

US 2007/0020400 A1    Jan. 25, 2007

Related U.S. Application Data

(60) Provisional application No. 60/701,810, filed on Jul. 22, 2005.

(51) Int. Cl.
*B05D 5/06*    (2006.01)
*B05D 5/12*    (2006.01)
(52) U.S. Cl. .................................................. 427/58
(58) Field of Classification Search ............ 427/76, 427/97.3, 399
See application file for complete search history.

(56) References Cited

U.S. PATENT DOCUMENTS

| 5,534,328 | A |   | 7/1996 | Ashmead et al. |
| 5,575,855 | A | * | 11/1996 | Kanai et al. .................. 118/718 |
| 5,580,523 | A |   | 12/1996 | Bard |
| 6,129,973 | A |   | 10/2000 | Martin et al. |
| 6,192,596 | B1 |   | 2/2001 | Bennett et al. |
| 6,225,149 | B1 |   | 5/2001 | Gan et al. |
| 6,537,506 | B1 |   | 3/2003 | Schwalbe et al. |
| 6,676,835 | B2 |   | 1/2004 | O'Connor et al. |
| 6,749,814 | B1 |   | 6/2004 | Bergh et al. |
| 6,814,859 | B2 |   | 11/2004 | Koehler et al. |
| 6,863,867 | B2 |   | 3/2005 | Vanden Bussche et al. |
| 6,932,951 | B1 | * | 8/2005 | Losey et al. .................. 422/211 |
| 6,935,772 | B2 | * | 8/2005 | Karp et al. .................... 366/341 |
| 6,981,522 | B2 |   | 1/2006 | O'Connor et al. |
| 7,150,815 | B2 |   | 12/2006 | Ashmead et al. |
| 7,341,917 | B2 | * | 3/2008 | Milliron et al. ............. 438/285 |

(Continued)

OTHER PUBLICATIONS

John and Andrew deMello, The Royal Society of Chemistry, 4, (2004) pp. 1N-15N.*

(Continued)

*Primary Examiner*—Michael Cleveland
*Assistant Examiner*—Tabassom Tadayyon Eslami
(74) *Attorney, Agent, or Firm*—Klarquist Sparkman, LLP

(57) ABSTRACT

Embodiments of the present system and method are useful for chemical deposition, particularly continuous deposition of thin films. Disclosed systems typically comprise a micromixer and a microchannel applicator. A deposition material or materials is applied to a substrate, such as an oxidized silicon substrate, a flexible substrate useful for forming flexible devices, such as flexible transistors, and combinations of different substrates. Uniform and highly oriented surface morphologies of films deposited using disclosed embodiments are clearly improved compared to films deposited by a conventional batch process. The process can be used to tailor the composition and morphology of the material deposited on a substrate. The present process can be used at low temperatures as a post-deposition, high-temperature annealing step is obviated.

21 Claims, 42 Drawing Sheets

U.S. PATENT DOCUMENTS

| | | | |
|---|---|---|---|
| 2002/0045265 | A1 | 4/2002 | Bergh et al. |
| 2003/0047816 | A1* | 3/2003 | Dutta .......................... 257/788 |
| 2003/0052429 | A1 | 3/2003 | Vigna et al. |
| 2004/0256230 | A1 | 12/2004 | Yager et al. |
| 2007/0240989 | A1* | 10/2007 | Levitan et al. .............. 204/451 |

OTHER PUBLICATIONS

Brent A. Ridley et al, Science, 286(1999) pp. 746-749.*

Bret Ridley, PhD Thesis, MIT(1999).*

Voss, C. et al., "Growth Kinetics of Thin-Film Cadmium Sulfide by Ammonia-Thiourea Based CBD," *Journal of the Electrochemical Society*, 151(10), pp. C655-C660 (2004).

Hessel et al., "Micro mixers—a review on passive and active mixing principles", *Chem. Eng. Sci.* 60, 2479 (2005).

Chang, Y.J. et al., "Nanocrystalline CdS MISFETs Fabricated by a Novel Continuous Flow Microreactor," *Electrochemical and Solid-State Letters*, 9(5), G174-G177 (2006).

U.S. Appl. No. 10/803,502, filed Mar. 17, 2004, Paul et al.

U.S. Appl. No. 11/086,074, filed Mar. 21, 2005, Chang et al.

U.S. Appl. No. 11/086,074: Non-Final Office Action, dated Apr. 1, 2008.

U.S. Appl. No. 10/803,502: Non-Final Office Action, dated Jun. 6, 2008.

* cited by examiner

METHOD AND APPARATUS FOR CHEMICAL DEPOSITION

CROSS REFERENCE TO RELATED APPLICATION

The present application claims the benefit of the earlier filing date of U.S. provisional application No. 60/701,810, filed on Jul. 22, 2005, which is incorporated herein by reference.

ACKNOWLEDGEMENT OF GOVERNMENT SUPPORT

The present invention was developed, at least in part, using funds from the National Science Foundation's Process and Reaction Engineering program under CAREER grant No. CTS-0348723. The United States Government has rights in this invention.

FIELD

The present disclosure concerns a process for depositing materials, generally as thin films, on substrates, particularly a chemical bath deposition process that uses a microchemical system comprising a micromixer, a microchannel fluid applicator, or both, and articles made according to the process, including electronic devices, such as flexible transistors, solar cells, light emitting diodes, detectors and sensors.

BACKGROUND

Inexpensive and flexible integrated circuits are needed to continue the digital revolution. One approach to making inexpensive and flexible integrated circuits is to fabricate semiconductor devices on flexible polymeric substrates using low temperature processes. Chemical bath deposition (CBD), the aqueous analogue of chemical vapor deposition with the constituent ions dissolved in a water solution, can be used to deposit epitaxial semiconductor layers at low temperatures. CBD has been successfully used as a batch process to deposit many semiconductor compounds, including $Ag_2S$, CdS, CdSe, CoS, $Cu_2S$, PbS, SnS, SnO, $MoS_2$, SbS, $TiO_2$, ZnO, SnSe, CdSnS, $CuInSe_2$, and PbHgS. Batch CBD processes also have been used to make thin film transistors. Gan et al., U.S. Pat. No. 6,225,149, for example, entitled "Method to Fabricate Thin Film Transistors and Circuits," describes forming thin film transistors by preparing a chemical deposition bath and depositing a semiconductor layer using the chemical bath.

In recent years, metal chalcogenide semiconductors have received much attention for electronic and optoelectronic applications. Typically, metal chalcogenides are deposited as binary or ternary compounds including sulfide, selenide and telluride using a variety of techniques, including electrodeposition, vacuum evaporation, Successive Ionic-Layer Adsorption and Reaction, spray pyrolysis, sputtering, chemical vapor deposition (CVD) and chemical bath deposition CBD. Batch CBD processes already have proved useful for fabricating large area devices, such as high efficiency $CuInSe_2$ and CdTe solar cells. P. K. Nair, M. T. S. Nair, V. M. Garcia, O. L. Arenas, Y. Pena, A. Castillo, I. T. Ayala, O. Gomez-daza, A. Sanchez, J. Campos, H. Hu, R. Suarez, M. E. Rincon. *Sol. Energy Mater. Sol. Cells.* 1998, 52, 313. O. Savadogo. *Sol. Energy Mater. Sol. Cells.* 1998, 52, 361.

Though CBD has many advantages, it also has drawbacks. One major drawback is the formation of particles, as well as the unwanted deposition that occurs with such processes, which generates waste and causes device defects. For batch CBD processes, the heat needed for chemical reaction may be supplied from the solution bath to the sample surface. With reference to CdS as an example, this results in both heterogeneous CdS nucleation at the surface as well as homogeneous CdS formation in the bath. Hence, with thermal jacket baths (glass beaker etc.) or water baths, significant CdS deposition also occurs on the walls of the vessels. The bath must be stirred continuously to ensure uniform thermal and chemical mixing and to minimize adhesion of homogeneously nucleated CdS particles to the growing film surface. Moreover, the unequal bath volumes used to form desired CdS films generates substantial waste and also creates device defects. Efforts have been made to reduce the bath-to-surface volume using cover plates. P. K. Nair, V. M. Garcia, O. Gomez-Daza, M. T. S. Nair, *Semicond. Sci. Technol.* 2001, 16, 855. Batch CBD processes also typically require that the deposited material be subjected to relatively high-temperature annealing processes. These high-temperatures generally are not compatible with substrates, such as polymeric materials, that are used to make flexible electronic devices, such as flexible transistors.

Batch CBD processes are quite useful. However, a low-temperature process that combines large area deposition with high utilization and growth rate for high conversion efficiencies and precise control over particle formation and deposition has not yet been demonstrated.

SUMMARY

Embodiments of the present system for chemical deposition, particularly continuous deposition of thin films, typically comprise: a micromixer, such as an interdigital micromixer or other type of micromixer [such as disclosed in V. Hessel et al., *Chem. Eng. Sci.* 60, 2479 (2005), which is incorporated herein by reference]; a microchannel applicator; or both. Additional examples of micromixers and microchannel devices are disclosed in U.S. patent application Ser. No. 11/086,074, which is incorporated therein by reference. The present system and process provide a substantially constant flux of reactant solution that allows control over the homogeneous reaction of the chemical bath solution before the solution impinges on the substrate.

Working embodiments of the system typically include at least a first fluid source, more typically at least a first and second fluid source, operably coupled to an micromixer. The mixer effectively mixes fluids to initiate formation of the deposition material. A microchannel applicator may then be used to apply the deposition fluid to a substrate, such as an oxidized silicon substrate. Particular embodiments may use flexible substrates, such as polymeric materials, to form, for example, flexible transistors, light emitting diodes, detectors, and sensors.

A person of ordinary skill in the art will appreciate that the system can include other components, such as components that facilitate chemical deposition. For example, the deposition system may comprise a heater operably coupled to the substrate for heating the substrate. Furthermore, the system may comprise at least one pump for pumping the first and/or second fluids, or at least two pumps for pumping the first and second fluids through the system, such as to the micromixer. Transmission electron microscopy analysis indicated that an impinging flux without the formation of nanoparticles could be obtained using embodiments of the process and system of the present invention.

Uniform and highly oriented materials, such as nanocrystalline semiconductor thin films, were successfully deposited on oxidized silicon substrates using the system. The surface morphologies of the deposited materials were characterized by atomic force microscopy (AFM), scanning electron microscopy (SEM) and 3D Dektak surface profiler. These analyses clearly indicated an improvement of film smoothness and coverage compared to films deposited from a batch process.

A process for chemical deposition, particularly of thin films, also is described. One embodiment of the process comprises providing a first reactant, providing a second reactant, and flowing the first and second reactants to a micromixer to mix the first and second reactants, thereby initiating formation of a deposition material. A person of ordinary skill in the art will appreciate that formation of some deposition materials may require mote than 2 reactant streams. The deposition material is then applied to substrate, such as by using a microchannel applicator.

A person of ordinary skill in the art will appreciate that the process and system can be used to make and/or apply many of different deposition materials, depending on the result desired in the device constructed using the method and/or system. Solely by way of example and without limitation, at least a first reactant, and generally at least a second reactant, may be selected to form deposition materials, such as Au, Ag, Cu, Co, Cr, Ge, Ni, Pt, Pd, Rh, Se, Si, Ru, $Ag_2S$, $Ag_2Se$, AgO, $Ag_2O$, $Al_2O_3$, $As_2S_3$, BaO, $Bi_2S_3$, $Bi_2Se_3$, CdO, CdS, CdSe, CdSnO, CdTe, CdZnS, $CeO_2$, CoS, CoSe, CoO, $CrO_2$, $CuBiS_2$, $CuGaSe_2$, $Cu(In,Ga)Se_2$, $CuInSe_2$, $CuInS_2$, $Cu_{2-x}S$, $Cu_{2-x}Se$, $Cu_2O$, FeO(OH), $Fe_2O_3$, $Fe_3O_4$, GaAs, GaN, $Ga_2O_3$, GaP, Ge, $GeO_2$, $HfO_2$, HgS, HgSe, InGaAs, InAs, $In_2O_3$, InP, $In_2S_3$, $In_2Se_3$, $La_2O_3$, MgO, MnS, $MnO_2$, $MoO_2$, $MoS_2$, $MoSe_2$, $NbO_2$, NiS, NiSe, NiO, PbHgS, PbS, PbSe, PbTe, $PbO_2$, $ReO_3$, $RhO_2$, $RuO_2$, $Sb_2S_3$, $Sb_2Se_3$, SiGe, $SiO_2$, SnS, $SnS_2$, SnSe, $SnO_2$, $Sb_2S_3$, $TiO_2$, TlS, TlSe, $Tl_2O_3$, $VO_2$, $WO_2$, $Y_2O_3$, ZnO, ZnSe, $ZrO_2$, or combinations thereof.

Certain working embodiments exemplify the invention by reference to the production and/or application to a substrate of CdS, ZnO and $In_xO$. For CdS deposition, the first reactant typically was a cadmium halide, such as cadmium chloride, and the second reactant comprised thiourea.

A person of ordinary skill in the art also will appreciate that the first reactant, the second reactant, or both may comprise additional materials suitable for various functions, such as to facilitate the deposition process. For example, such compositions may include a complexing agent or agents, such as a nitrogen-bearing compound, with ammonia being one example of a suitable nitrogen-bearing complexing agent.

The process can be used to tailor the composition and morphology of the material as deposited on a substrate. For example, where a thin film is deposited on a substrate, the film may be an epitaxial nanostructured thin film, a nanocrystalline thin film, an epitaxial thin film comprising embedded nanocrystals, a superlattice thin film, a composition gradient thin film, a composite thin film comprising core-shell nanoparticles, and combinations thereof. Desired particles can be produced by a chemical bath deposition process by controlling the residence time of the mixed reacting solution, by using a combined chemical bath deposition and solution-based nanoparticle synthesis process, or by using a nanoparticle solution directly.

One advantage of the present process is that it can be used at low temperatures as a post-deposition, high-temperature annealing step is obviated. This allows process flexibility relative to known processes. For example, because high temperature annealing processes are avoided, candidate substrate materials are significantly increased, and include flexible substrate materials, such as polymeric materials, that cannot be used for known, high-temperature chemical bath deposition processes.

The process can be used to produce particular products, such as electronic devices including, without limitation, transistors, flexible transistors, solar cells, flexible solar cells, light emitting diodes, flexible light emitting diodes, detectors, flexible detectors, sensors, flexible sensors, switches, flexible switches, etc. The process for making devices comprises at least one step comprising flowing at least a first, and typically plural, reactants to a micromixer to mix the first and second reactant and initiate formation of a deposition material. The deposition material may then be applied to a substrate using a microchannel applicator. Working embodiments of the process were used to make CdS MISFETs.

The foregoing and other objects, features, and advantages of the invention will become more apparent from the following detailed description, which proceeds with reference to the accompanying figures.

DETAILED DESCRIPTION

I. CBD

A. CBD Generally

The fundamental aspects of CBD are similar to that of a CVD process. Without being limited to a theory of operation, CBD generally involves mass transport of reactants, adsorption, surface diffusion, reaction, desorption, nucleation, and growth. Earlier studies suggested a colloidal-by-colloidal growth model. I. Kaur, D. K. Pandya, K. L. Chopra, *J. Electrochem. Soc.*, 1980, 140, 943. However, more recent investigations by Ortega-Borges & Lincot, based on initial rate studies using a Quartz Crystal Microbalance (QCM), suggested that different growth kinetics are involved. R. Ortega-Borges, D. Loncot, *J. Electrochem. Soc.*, 1993, 140, 3464. Ortega-Borges et al. identified three growth regimes: an induction period with no growth observed; a linear growth period; and finally a colloidal growth period, followed by the depletion of reactants. Ortega-Borges et al. proposed a molecular level heterogeneous reaction mechanism according to the equations provided below.

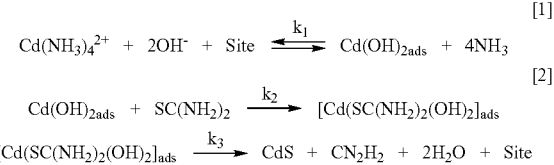

This model has provided a good understanding of CBD processes at the molecular level. It is well known that particle formation plays an important role in CBD processes. Kostoglou et al. reported a detailed and comprehensive model for a CBD process for depositing CdS. M. Kostoglou, N. Andritsos, A. J. Karabelas, *Ind. Eng. Chem. Res.*, 2000, 39, 3272. This model includes particle nucleation, growth, and deposition in addition to molecule-by-molecule film growth.

Figure 1:
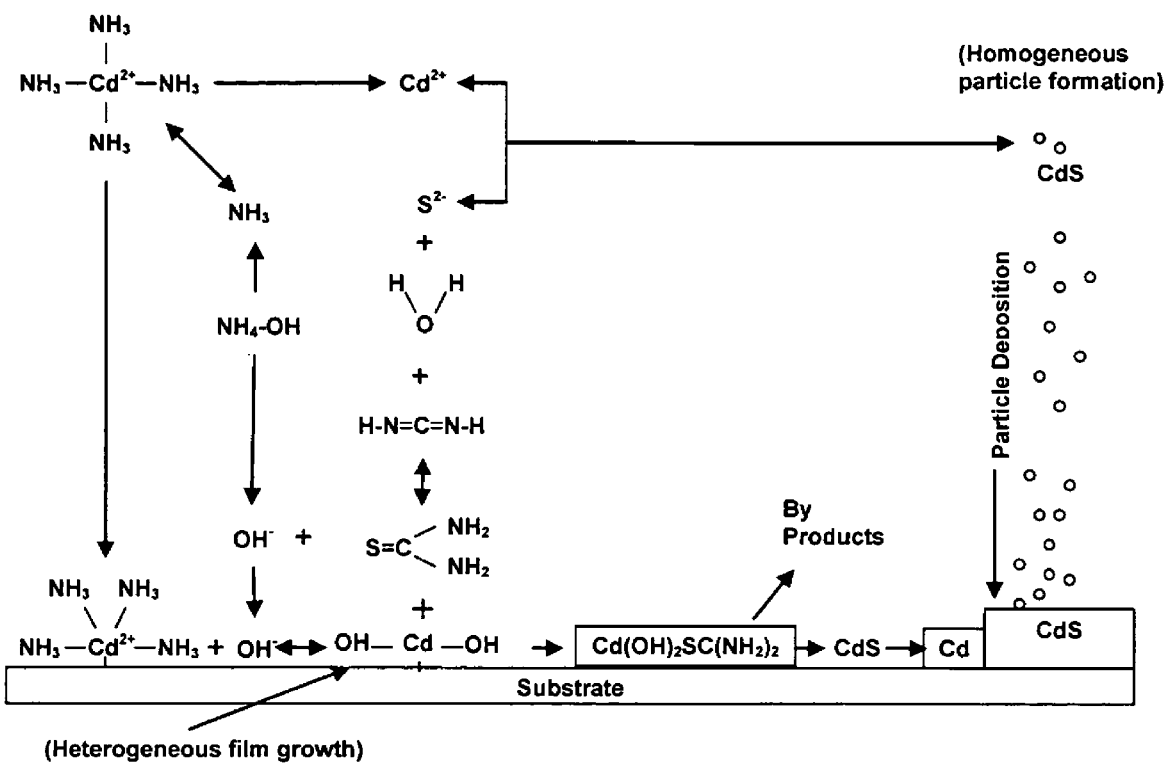
FIG. 1 is a schematic diagram illustrating CBD-CdS growth mechanisms.

FIG. 1 is a schematic diagram of CBD-CdS growth mechanisms that illustrates the results associated with both homogeneous and heterogeneous reactions. Small particles form and grow even at the beginning of the process as observed by dynamic light scattering and TEM measurements. C. Voss, Y.

J. Chang, S. Subramanian, S. O. Ryu, T.-J. Lee, C.-H. Chang, *J. Electrochem. Soc.*, 2004, 151(10), C655, incorporated herein by reference. These experimental results indicated the importance of particle formation even in the linear growth regime. It is desirable to develop a process that de-couples homogeneous particle formation and deposition from the molecular level heterogeneous surface reaction for a better understanding and optimization of CBD processes.

B. Deposition Materials

A person of ordinary skill in the art will appreciate that the present CBD process can be used to deposit a variety of different materials. Disclosed embodiments of the present invention are exemplified with reference to particular materials, such as cadmium sulfide (CdS), zinc oxide (ZnO), and indium oxide ($In_xO$), and the use of such materials to form particular electronic devices, such as transistors. Many different materials can be deposited using the present system, not just the CdS, ZnO and $In_xO$ materials used to exemplify the invention, and many devices other than transistors also can be produced using the system and process. The appropriate selection of a deposition material, and hence reactants potentially useful for forming the desired deposition material, will depend on several factors, including the end use of the device constructed. For example, the composition of the material to be deposited can be selected to provide a desired result in a product made using the material. Once the deposition material is identified, the reactants used to form the deposition material can be varied to maximize reaction efficiency, reduce production costs, decrease or minimize toxicity, waste, etc., and combinations thereof. Other variables also can be manipulated, such as: varying the concentration of the material to be deposited; using complexing agents, such as nitrogen-bearing compounds, including ammonia, to facilitate the process; potentially varying the solvent or suspending liquid to be other than water; and combinations of such variations.

Solely by way of example and without limitation, useful materials that may be formed and deposited by the present CBD process include Au, Ag, Cu, Co, Cr, Ge, Ni, Pt, Pd, Rh, Se, Si, Ru, $Ag_2S$, $Ag_2Se$, AgO, $Ag_2O$, $Al_2O_3$, $As_2S_3$, BaO, $Bi_2S_3$, $Bi_2Se_3$, CdO, CdS, CdSe, CdSnO, CdTe, CdZnS, $CeO_2$, CoS, CoSe, CoO, $CrO_2$, $CuBiS_2$, $CuGaSe_2$, Cu(In,Ga)$Se_2$, $CuInSe_2$, $CuInS_2$, $Cu_{2-x}S$, $Cu_{2-x}Se$, $Cu_2O$, FeO(OH), $Fe_2O_3$, $Fe_3O_4$, GaAs, GaN, $Ga_2O_3$, GaP, Ge, $GeO_2$, $HfO_2$, HgS, HgSe, InGaAs, InAs, $In_2O_3$, InP, $In_2S_3$, $In_2Se_3$, $La_2O_3$, MgO, MnS, $MnO_2$, $MoO_2$, $MoS_2$, $MoSe_2$, $NbO_2$, NiS, NiSe, NiO, PbHgS, PbS, PbSe, PbTe, $PbO_2$, $ReO_3$, $RhO_2$, $RuO_2$, $Sb_2S_3$, $Sb_2Se_3$, SiGe, $SiO_2$, SnS, $SnS_2$, SnSe, $SnO_2$, $Sb_2S_3$, $TiO_2$, TlS, TlSe, $Tl_2O_3$, $VO_2$, $WO_2$, $Y_2O_3$, ZnO, ZnS, ZnSe, $ZrO_2$, etc., and combinations thereof.

Again by way of example, and without limitation, CdS can be made from a source of cadmium (II) and a source of sulfide. Examples, without limitation, of a suitable Cd (II) source are the halides, such as cadmium chloride ($CdCl_2$). The cadmium (II) source is then combined with a sulfide source, such as thiourea, to form CdS. A working embodiment of the present invention useful for forming CdS used a continuous microreactor system; a first solution comprising 24 milliliters of cadmium chloride, ammonium chloride and ammonium hydroxide; and a second mixture comprising aqueous thiourea. The concentrations of the materials for this working embodiment were 0.004 M $CdCl_2$, 0.04 M $NH_4Cl$, 0.04 M thiourea, and 0.4 M $NH_4OH$.

Zinc oxide also has been processed using working embodiments of the present apparatus and system. For ZnO, the continuous deposition reactor included a microprocessor-controlled dispensing pump (ISMATEC® pumps), a T-mixer, and a substrate heater. The ZnO thin films were prepared from source solutions of A, comprising 200 milliliters of 0.005 M zinc acetate, and 10 milliliters of 0.25 M ammonium acetate; and B, comprising 200 milliliters of 0.1 M sodium hydroxide. The source solutions were mixed through a T-mixer and entered a micro-tube, which was immersed in an 80° C. hot bath. The mixture was impinged on a substrate that was maintained at 80° C. by a heater.

Indium oxide also has been processed using working embodiments of the present invention and system. An indium oxide thin film was deposited using 0.03 M $InCl_3$ dissolved in acetonitrile solvent and pumped through a microprocessor-controlled dispensing pump (ISMATEC® pumps). The solution passed through a micro-tube and impinged on a heated substrate that was maintained at 70° C. A working thin film transistor was fabricated from an indium oxide film as discussed further in the examples.

As will be apparent to a person of ordinary skill in the art, many of the metals, alloys, semiconductors, etc., that are desirably deposited using the present invention are produced by mixing precursor materials that react to form the desired deposition material. Any effective metal precursor material can be used with the present invention. Solely by way of example, and without limitation, particular examples of metal precursors include halides, acetates, nitrates, sulfates and carbonates. Mixtures of such precursors also can be used.

The reactant sources can be formulated with other materials that facilitate the process. For example, the metal source, such as the cadmium (II) source, can be formulated with other materials, such as complexing agents. Many of the useful complexing agents are nitrogen-bearing compounds, including by way of example, and without limitation, ammonia, aliphatic amines, aliphatic amides, with particular examples including ammonia, triethanolamine, ethanolamine, diethylenetriamine, ethylenediaminetetracetate, hydrazine, nitrilotriacetate and triethylenetriamine. Plural different complexing agents also can be used in combination. The reactant sources also can be formulated in different solvents, such as water and/or organic solvent(s), to form a first fluid mixture. Thiourea also can be combined with other materials, such as ammonia and water, to form a second mixture. The deposition material, such as cadmium sulfide, is then formed by combining the first mixture with the second mixture.

The reactants also can include chalcogens, and hence chalcogenide precursors are compounds potentially useful for practicing the present invention. Examples of chalcogenide precursors include, by way of example and without limitation, thiourea, thioacetamide, thiocarbazide, thiosemicarbazide, ethylthiourea, allylthiourea, selenourea, N,N dimethyl selenourea, thiosulfate, selenosulfate, water, peroxide, persulfate, sodium hydroxide, urea, dimethylamineborane, trimethylamineborane, acetamide, hexamethyleneteramine, and combinations of such materials.

II. Continuous Flow CBD Systems

A. Working Embodiments

Figure 2:
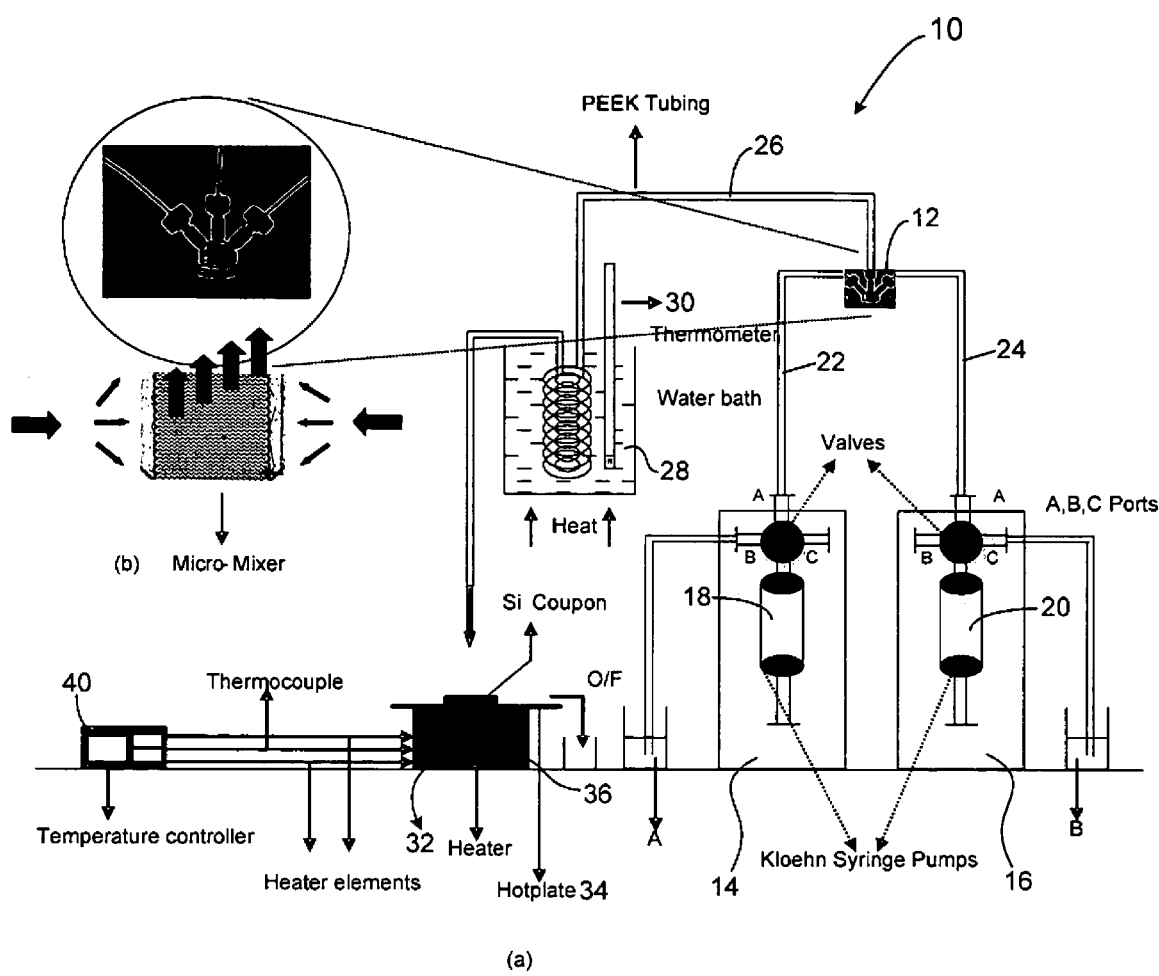
FIG. 2 is a schematic diagram of one embodiment of a continuous flow microreactor system.

Embodiments of a continuous flow microreactor system have been developed for performing CBD. FIG. 2 is a schematic diagram of one embodiment of a continuous flow microreactor CBD system 10. System 10 includes a mixer 12, particularly a micromixer, such as an interdigital micromixer. A detailed schematic diagram of one embodiment of a micromixer is shown in the FIG. 2 inset. Micromixers offer features that cannot be easily achieved using macroscopic devices, such as ultrafast mixing on the microscale. D. Bokenkamp, A.

Desai, X. Yang, Y.-C. Tai, E. M. Marzluff, S. L. Mayo., *Anal. Chem.*, 1998, 70, 232. As illustrated in FIG. 2, two fluids A and B to be mixed are introduced into the mixer 12, often as two counter-flowing fluid streams. For an interdigital micromixer 12, the two fluids A and B enter interdigital channels (30 μm in a working embodiment) and form plural interpenetrated substreams. The substreams exit the interdigital channels perpendicular to the direction of the feed flows, initially with a multilayered structure. Fast mixing through diffusion soon follows due to the small thickness of individual layers.

The continuous flow microreactor system 10 includes a reactant source, typically plural reactant sources, such as reactant sources 14, 16, that are combined to form the deposition material or materials. Again, as discussed above, the composition of the reactant sources 14 and 16 may vary, such as to provide desired deposition materials, reduce cost, reduce toxicity, provide flexibility in the selection of appropriate reactants, etc. The illustrated embodiment of system 10 includes two syringe pumps 18, 20 that pump desired quantities of reactants A and B at desired flow rates to the mixer 12. In working embodiments, two syringe pumps (V6 module from Kloehn Ltd.) of 25 milliliters each were used for reactant streams A and B. Each pump 18, 20 had three ports (A, B, C). One port of each pump aspirated the reactant streams and one port was used for dispensing the same. Syringe pumps 18, 20 were fluidly coupled to mixer 12 using polyetheretherketone (PEEK) conduits 22, 24 (1/16" OD, 0.03" ID from Upchurch Scientific).

For the illustrated embodiment, a commercial interdigital micromixer (SSIMM from Institut für Mikrotechnik Mainz, Germany)[13] was used. This interdigital micromixer included a stainless steel (SS 316Ti) housing with inlaid, thermally oxidized silicon to form 30 μm×100 μm microchannels. Reactant streams A and B were pumped through PEEK conduits 22 and 24, respectively, for mixing in mixer 12.

The fluid mixture flowing from mixer 12 comprises the chemical species useful for deposition. In the embodiment 10 illustrated in FIG. 2, conduit 26 was a 5-foot-long coil of PEEK. PEEK conduit 26 was immersed in a water bath 28 to provide temperature control. Water bath 28 generally was maintained at an effective temperature for CdS processing, such as a temperature of from about 80° C. to about 85° C. (using a VWR hot plate stirrer). A person of ordinary skill in the art will appreciate that the effective temperature may vary depending on, for example, the composition of the deposition material. Moreover, the homogeneous chemistry of the impinging flux can be controlled by selecting various factors, such as the length of the channel 26, the flow rate through channel 26, residence time in channel 26, etc., and combinations thereof.

The fluid mixture formed by mixing fluids A and B was made to impinge on substrate 32. In the illustrated embodiment, the substrate 32 was coupled to a metal plate 34. Certain embodiments of CBD are facilitated by heating. In the embodiment illustrated in FIG. 2, system 10 includes a hotplate 36 (2" dia.×0.75" thick SS disk from Watlow). For certain working embodiments employing CdS as a deposition material, the hot plate was maintained at a temperature of from about 80° C. to about 90° C. The temperature controller 40 was effectively coupled to the hot plate 36 to control the temperature thereof.

In a working embodiment for CdS, the syringe pumps were operated at a speed of 250 steps/sec. (Hz). The mean residence time of the mixture was about 5 seconds. Once the process was completed, the substrate 32 was removed from the plate 34, washed with Millipore DI water and dried under a stream of nitrogen gas.

Figure 3:
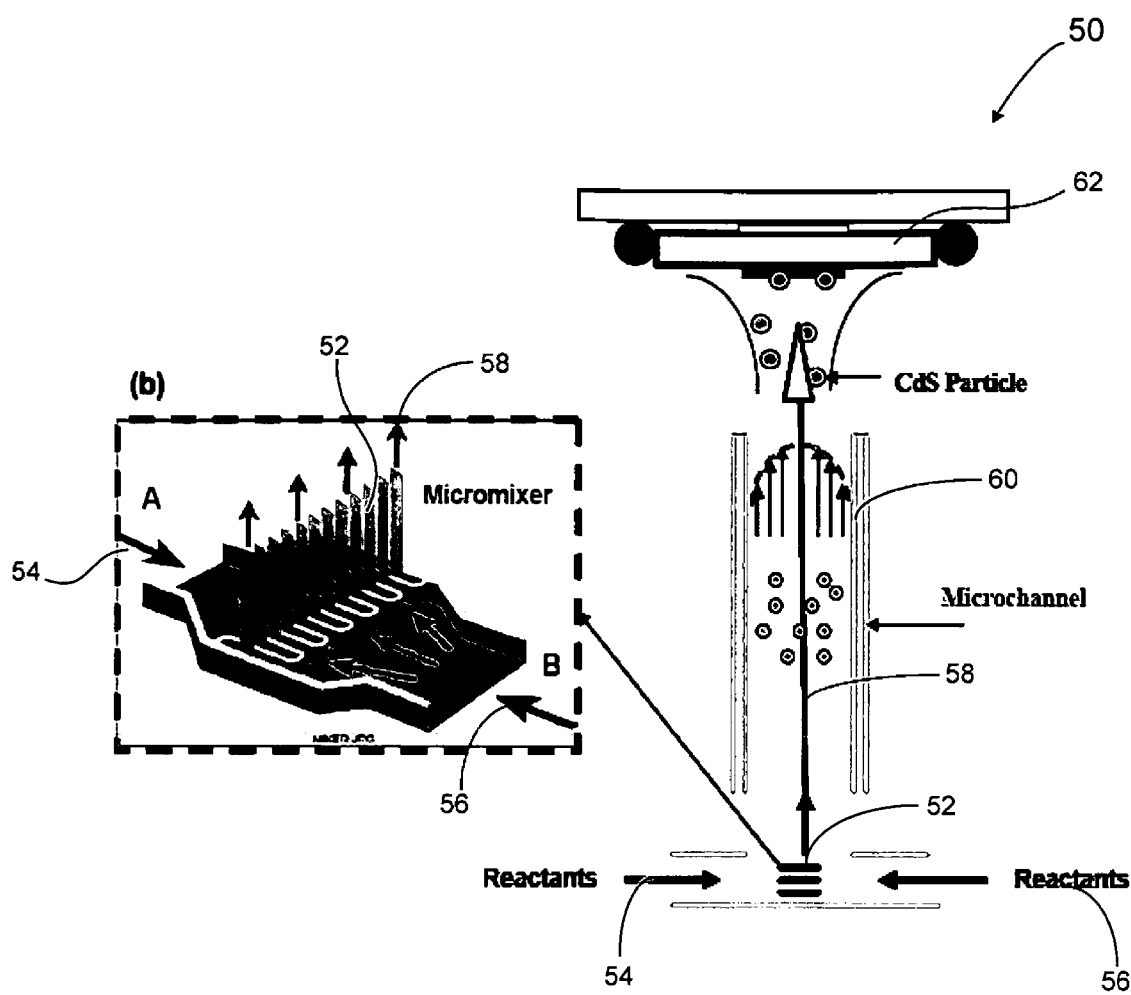
FIG. 3 is a schematic diagram of one embodiment of an impinging flow bath deposition reactor, with the inset illustrating one embodiment of an interdigital micromixer.

FIG. 3 is a schematic cross sectional drawing illustrating an impinging flow chemical bath deposition reactor 50. The inset to FIG. 3 is an enlarged view of the micromixer 52 illustrated schematically in FIG. 3. FIG. 3 shows that a first reactant stream 54 and a second reactant stream 56 flow into micromixer 52, thereby forming a third stream 58 comprising the desired chemical species for substrate deposition. Third stream 58 flows through a channel 60, particularly a microchannel, for direct impingement on to the substrate 62.

Figure 4:
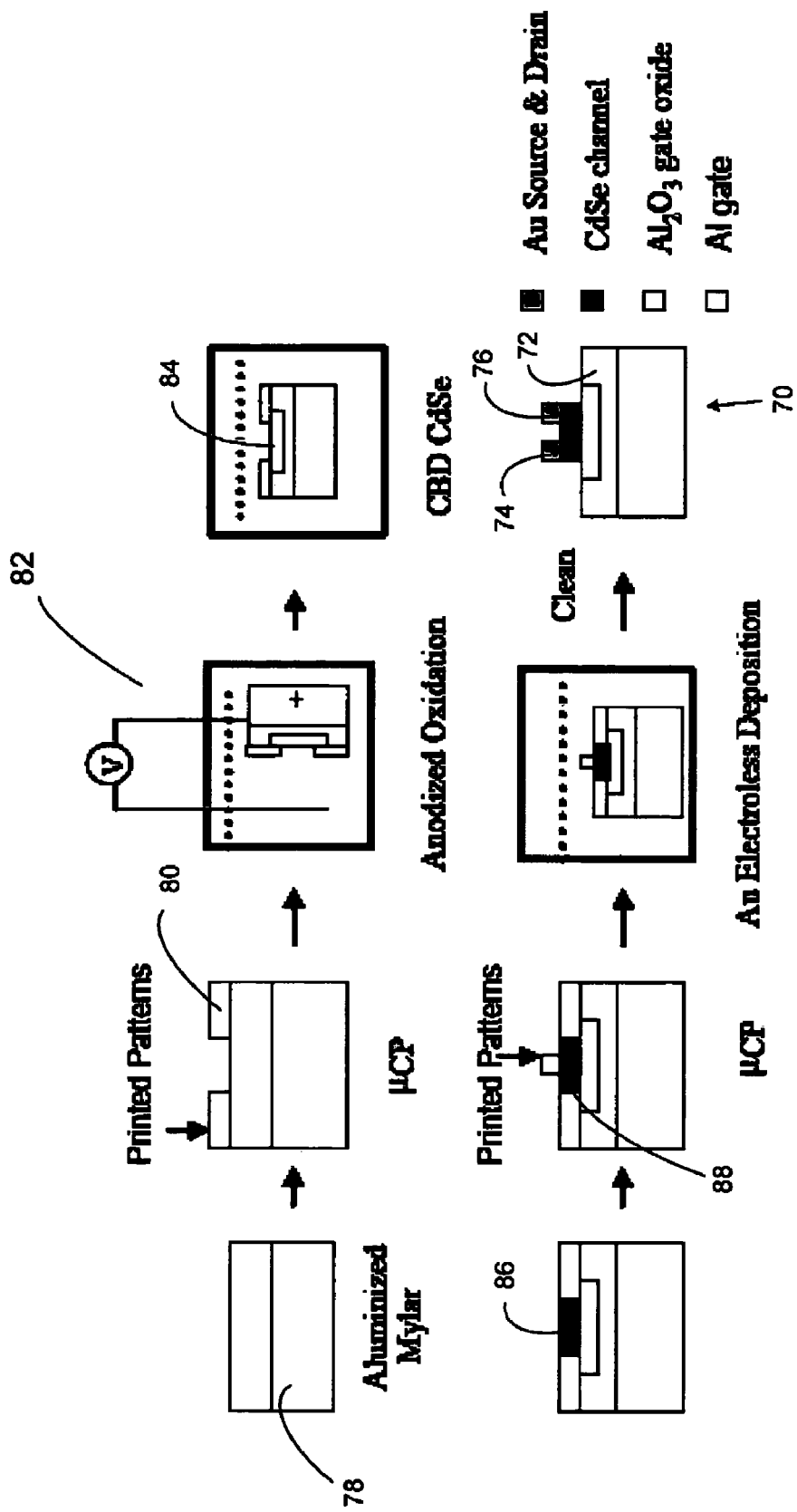
FIG. 4 is a schematic illustration of one embodiment of a process useful for forming a transistor.

FIG. 4 is a schematic representation of one embodiment of a process useful for forming transistors 70 comprising an aluminum gate 72 and gold source and drain 74, 76. FIG. 4 illustrates that a first component 78 comprising aluminized Mylar is provided. Printed patterns 80 are then formed on the aluminized Mylar substrate 78 using, for example, microcontact printing (μCP). μCP relies on replicating a patterned elastomeric stamp made from a master that can be inked with a self-assembled-monolayer-forming ink. The stamp is then used to print the desired pattern onto the surface of the substrate, which subsequently can be used as a mask. This technique has been used to fabricate field effect transistors with a gate length of about 20 μm. See, for example, "Patterning Organic-Inorganic Thin Film Transistors using Microcontact Printed Templates," *Appl. Phys. Lett.*, 79, 3536-3538 (2001); and "Using Soft Lithography to Fabricate GaAs/AlGaAs Heterostructures Field Effect Transistors," *Appl. Phys. Lett.* 71 (14), 202-2022 (1997), which are incorporated herein by reference. μCP has been used with alkanethiol inks to transfer patterns onto a gold surface. "Features of Gold having Micrometer to Centimeter Dimensions can be Formed through a Combination of Stamping with an Elastomeric Stamp and an Alkanethiol "ink" Followed by Chemical Etching," *Appl. Phys. Lett.*, 63, 2002-4 (1993), which is incorporated herein by reference. Alkanethiol chemistry and rolling stamp techniques can be easily adapted for large scale, roll-to-roll manufacturing processes. Alkylsiloxane chemistry can be used to pattern Al/$Al_2O_3$ surfaces. "An Introduction to Ultrathin Organic Films from Langmuir-Blodgett to Self-Assembly," Ulman, Academic Press (1991), which is incorporated herein by reference Again with reference to FIG. 4, once the printed patterns 80 are produced, the substrate 78 then may be subjected to an electrochemical anodization oxidation process (indicated as process step 82) to form aluminum oxide gate 84. A semiconductor material, such as CdSe, is then deposited using embodiments of a process and system of the present invention to produce a channel 86. Desired printed patterns 88 are then formed, such as by μCP, followed by deposition of gold to provide source and drain 74, 76. Post production processes, such as cleaning processes, also can be employed.

B. Commercial Implementation

Figure 5:
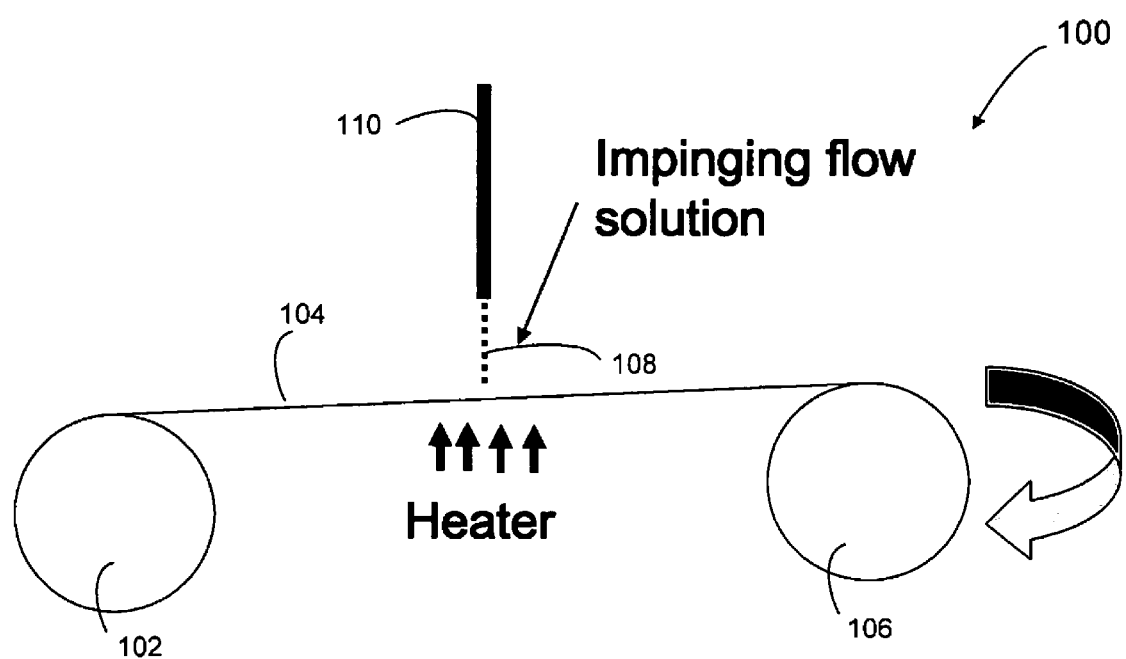
FIG. 5 is a schematic diagram illustrating one embodiment of a process using a roll-to-roll substrate susceptor or a substrate roll.

System 10 may be modified to provide various CBD systems. A commercial system 10 might include, for example, a continuous susceptor. FIG. 5 illustrates one embodiment of a continuous roll-to-roll susceptor 100. The illustrated embodiment includes a first roller 102 comprising a feed roll of a substrate or susceptor material 104. Material 104 is fed to a second roller 106. Rollers 102 and 106 move material 104 into a position effective to receive an impinging solution flow of a deposition material 108 from channel 110.

Figure 6:
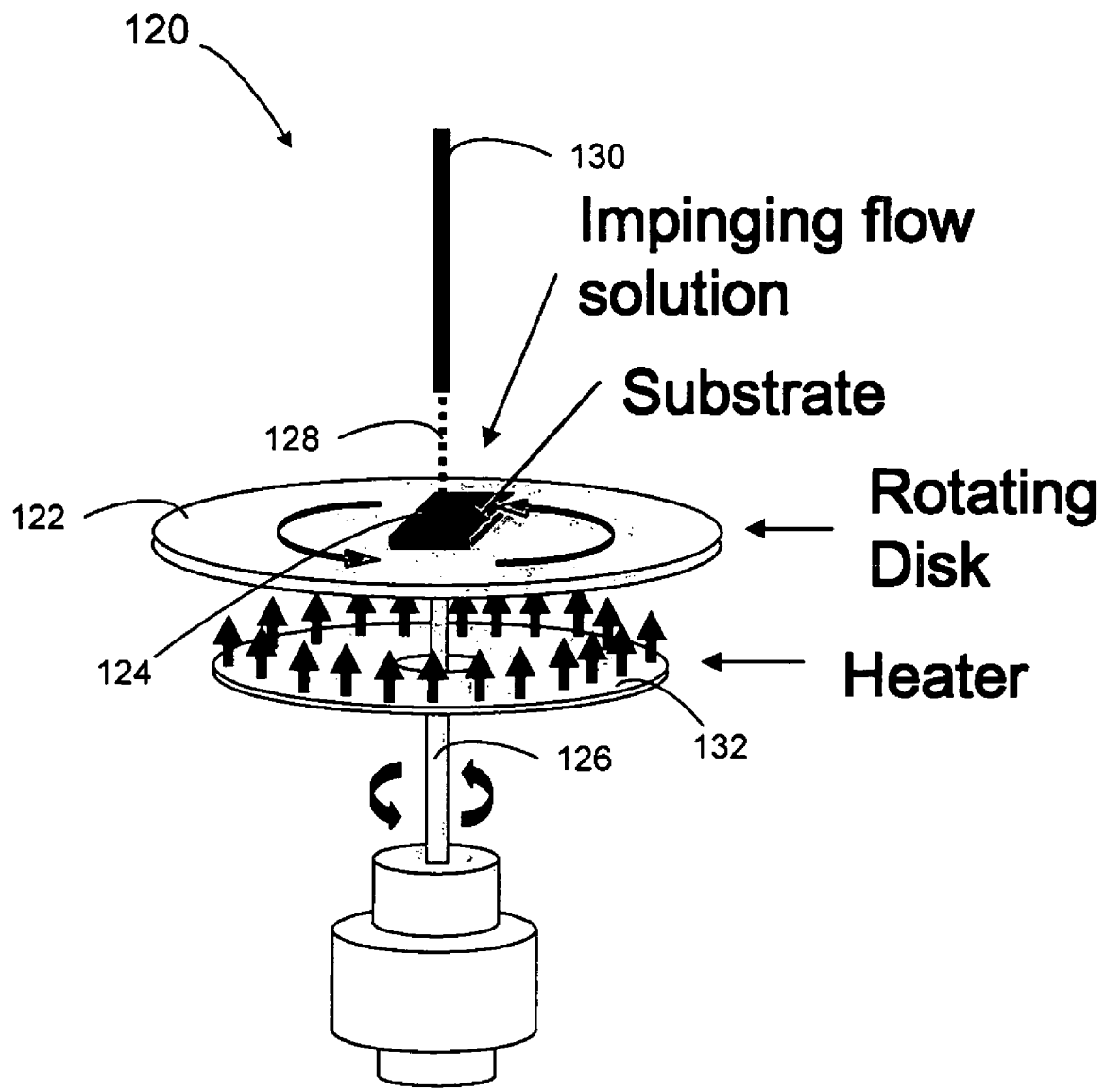
FIG. 6 is a schematic diagram of one embodiment of a rotating disk substrate susceptor.

Alternatively, system 10 may include a rotating disk substrate susceptor system 120, such as illustrated in FIG. 6.

System 120 includes a rotating disk 122. While the illustrated disk is substantially circular, a person of ordinary skill in the art will realize that the disk 122 need not be circular, and can have any geometric shape reasonably suited for use as a rotating disk susceptor. Substrate 124 is coupled to the disk 122 to allow rotation of the substrate 124. Disk 122 is effectively coupled to a rotator, such as a motor, via shaft 126.

An impinging solution flow of deposition material 128 is directed to substrate 124 via channel 130. As with other disclosed embodiments, heat may facilitate the deposition process. As a result, a heater 132 also optionally may be included in a manner effective to transfer heat to the substrate 124.

Figure 7:
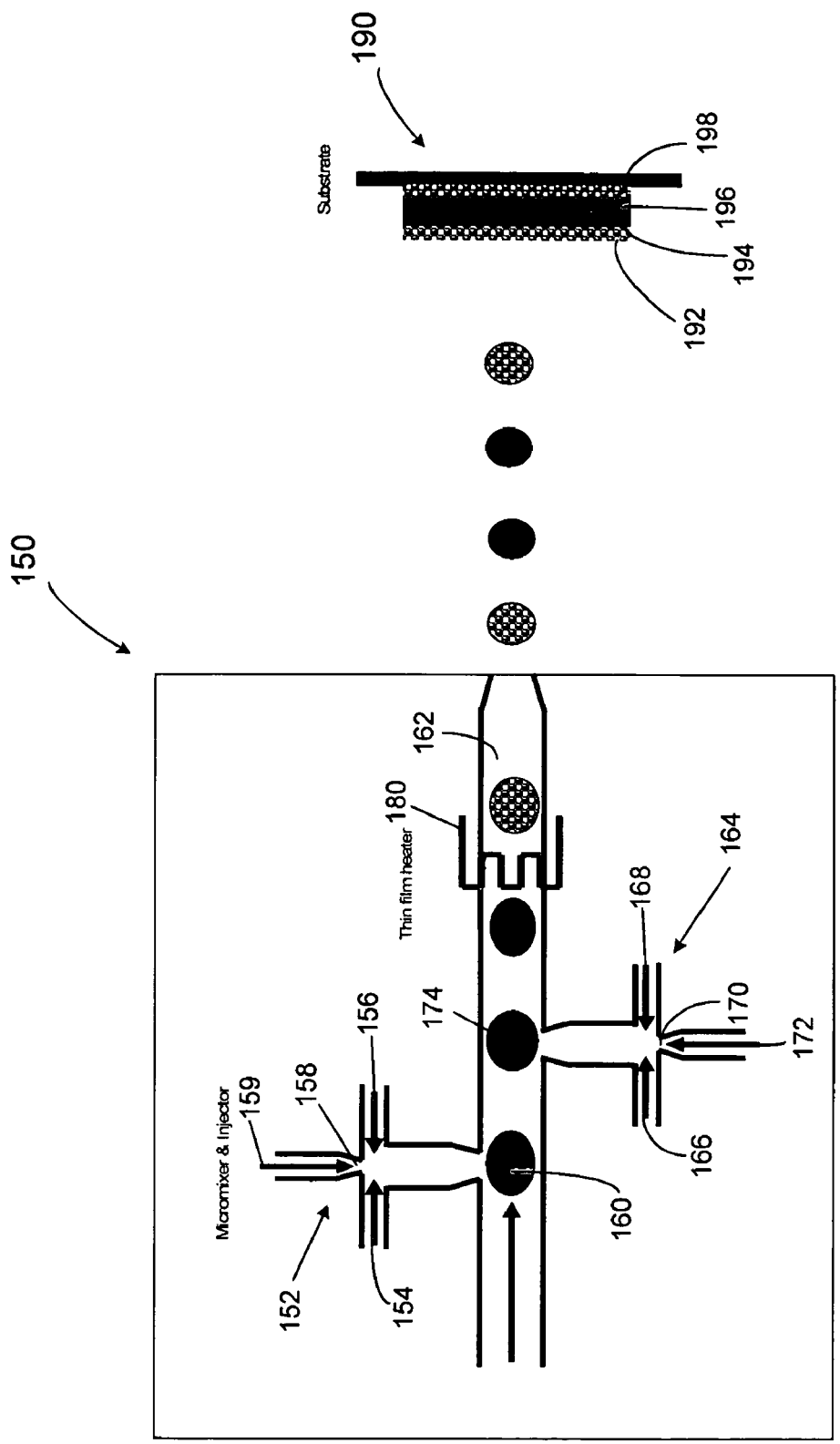
FIG. 7 is a schematic diagram of one embodiment of chip-based chemical mixing and deposition system.

System 10 also can be provided as a chip-based system. A schematic drawing of a chip-based system 150 is illustrated in FIG. 7. System 150 includes a first micromixer section 152. For embodiments comprising plural fluid reactants, at least a first fluid 154 and a second fluid 156 are flowed into the mixer 152. A third port, such as port 158, can be provided to aspirate fluids in mixer 152. Alternatively, at least a third fluid stream 159 can be flowed into micromixer system 152. The number and composition of the fluid streams will vary as determined by the chemical system in use. Impinging fluid streams 154, 156 and/or 159 are thoroughly mixed in mixer 152 to form a deposition material 160 that is flowed to the substrate via a fluid channel 162.

Many devices, such as electrical devices including transistors, may require deposition of a more than one material onto a substrate. Furthermore, such material(s) typically must be applied in a particular order to produce a working device. The possibility of depositing more than one material is contemplated by the chip-based system 150. In this embodiment, at least a second micromixer 164 optionally is provided. As with micromixer 152, at least a first fluid 166 and a second fluid 168 are flowed into the mixer 164. A third port 170 can be provided to aspirate fluids in mixer 164. Alternatively, at least a third fluid stream 172 can be flowed into micromixer 164. The fluid streams 166, 168 and/or 172 are mixed in mixer 164 to form a deposition material 174. Deposition material 174 may be the same as deposition material 160, or can be a different deposition material. Thus, by using plural different deposition materials, a deposited layer may have a composition gradient throughout its cross section.

System 150 can include a heat transfer section. One example of a device useful for heat transfer is a heater, such as a thin film heater 180.

Once formed, the deposition materials 160, 174, etc. are flowed through channel 162 to impinge on a substrate 190. Again, in the illustrated embodiment, the device formed includes plural layers 192, 194, 196 and 198, all of which layers may be different in composition or morphology, all of which layers may be the same in composition and morphology, and all possible combinations thereof.

Figure 8:
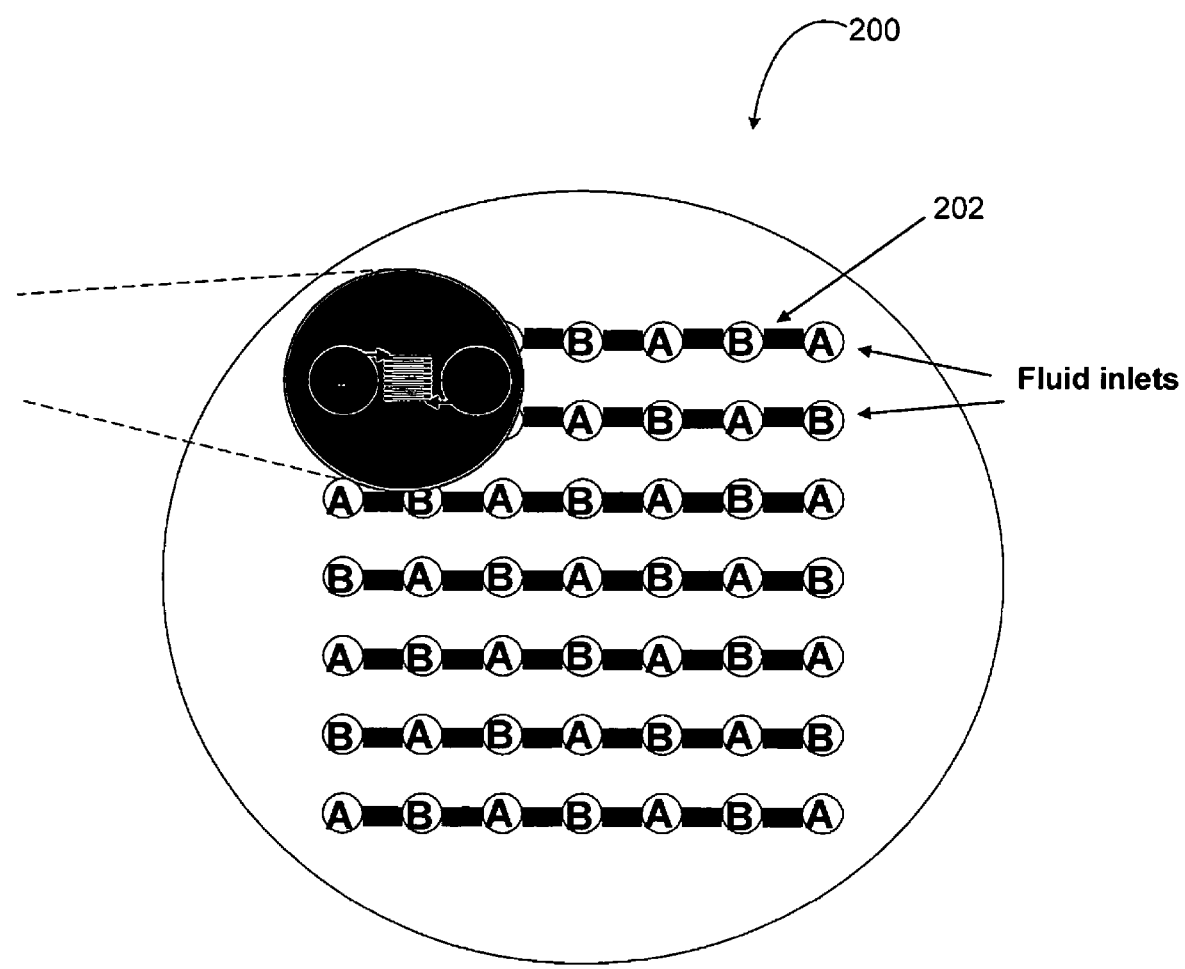
FIG. 8 is a schematic diagram of one embodiment of a micromixer array.

Micromixers are used effectively with certain embodiments of the present invention. Micromixers can be provided as unitary devices that can be used singularly, or plural such micromixers can be used. With chip-based systems, micromixer arrays, such as the array 200 shown in FIG. 8 comprising plural micromixers 202, can be used. One arrangement of plural micromixers to form an array is illustrated in FIG. 8. A person of ordinary skill in the art will appreciate that other micromixer arrangements can be used, such as a linear array of micromixers.

C. Thin Film Structures

Figure 9:
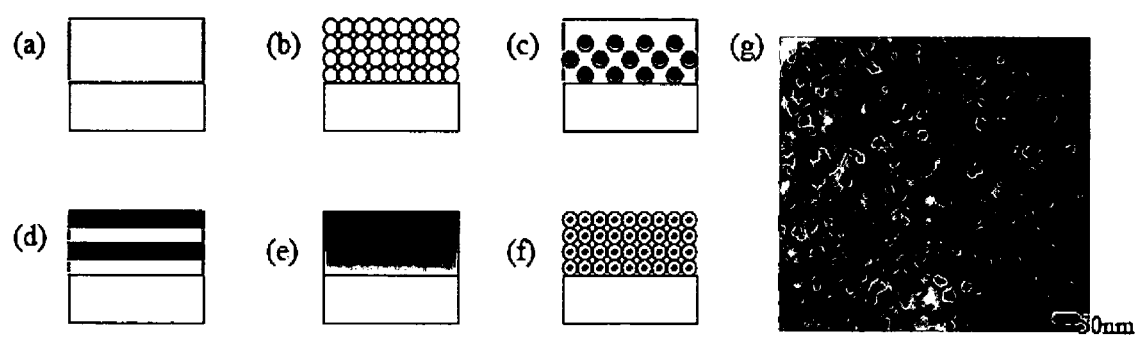
FIG. 9 is a schematic cross sectional drawing illustrating thin film morphologies that can be formed using embodiments of the present invention.

The present invention provides embodiments of a process and apparatus useful for depositing thin films on substrates. The process and apparatus can be used to deposit various films with tailored micro- and nanostructures. FIG. 9 is a schematic cross sectional representation providing examples of thin films that can be formed according to embodiments of the present invention. FIG. 9A is a schematic representation of an epitaxial nanostructured thin film; FIG. 9B is a schematic representation of a nanocrystalline thin film; FIG. 9C is a schematic representation of nanocrystals embedded in an epitaxial thin film; FIG. 9 D is a schematic representation of a superlattice thin film; FIG. 9E is a schematic representation of a composition gradient thin film; and FIG. 9F is a composite film comprising core-shell nanoparticles. FIG. 9G is a plan view TEM image of nanocrystalline CdS deposited by a batch CBD process.

III. Electronic Devices

The present system is useful for forming electronic devices. One example, without limitation, of such an electronic device is a transistor. The structure and materials used to form such electronic devices, including transistors, are known to a person of ordinary skill in the art.

Figure 10:
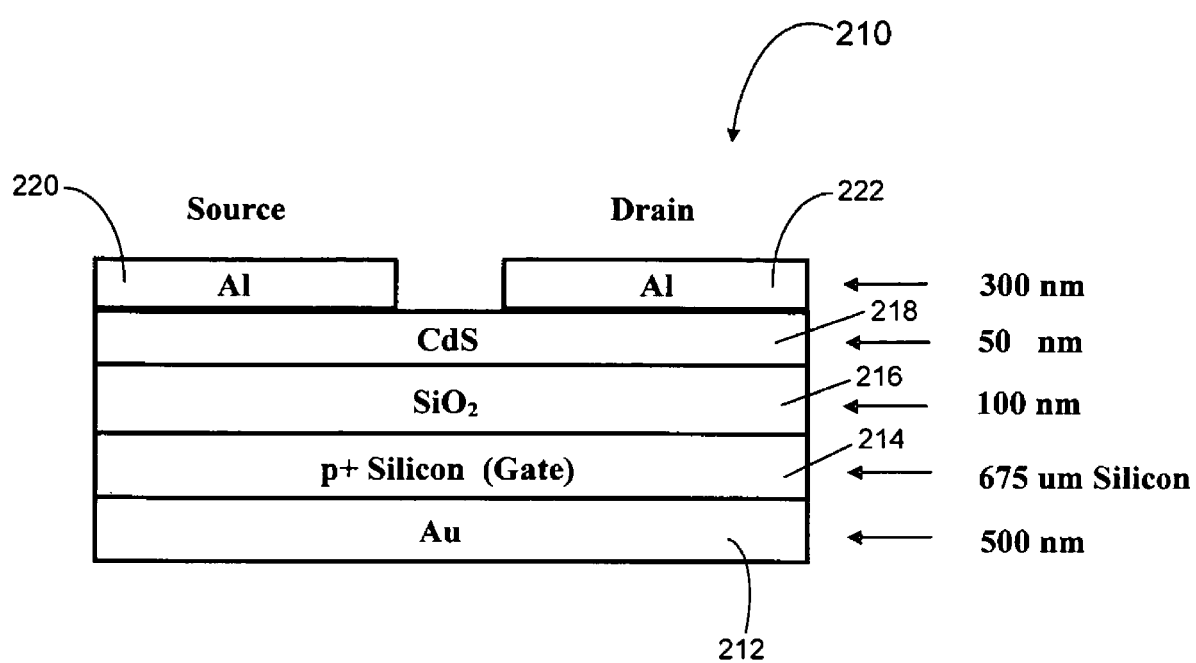
FIG. 10 is a schematic cross-sectional drawing of one embodiment of a CdS MISFET structure.

FIG. 10 is provided to exemplify devices that can be made according to the present invention. FIG. 10 is a schematic diagram of one embodiment of a CdS metal insulator semiconductor field effect transistor (MISFET) 210 that has been made using working embodiments of the present invention. MISFET 210 includes plural layers. The first layer 212 was a gold layer, approximately 500 nanometers in thickness. First layer 212 served as a gate contact. A boron (p+) doped silicon substrate, having a thickness of about 675 µm, was used to form gate layer 214. A silicon dioxide layer 216 was thermally grown on gate layer 214 to a thickness of about 100 nanometers. A cadmium sulfide layer 218, having a thickness of about 50 nanometers, was thin-film deposited onto the silicon dioxide layer using an embodiment of a continuous flow microreactor system of the present invention. Finally, aluminum source layer 220 and drain layer 222 were evaporated onto the CdS layer 218 through a shadow mask to a thickness of about 300 nanometers. Additional detail concerning formation of the MISFET 210 of FIG. 10 is provided below in the working examples.

IV. Characterization of Deposited Thin Films

Figure 11A:
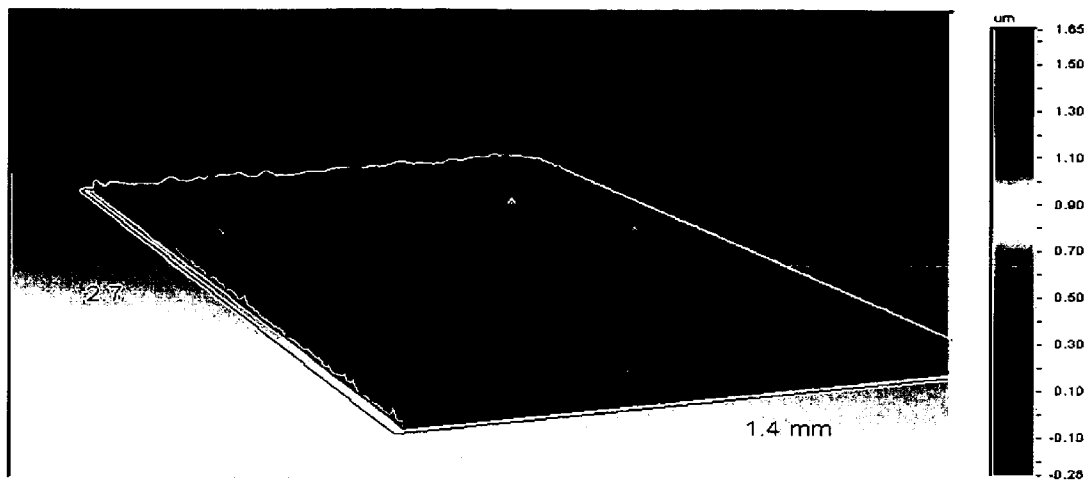
FIG. 11A is a surface profile image of a CdS film deposited by a batch reactor.
Figure 11B:
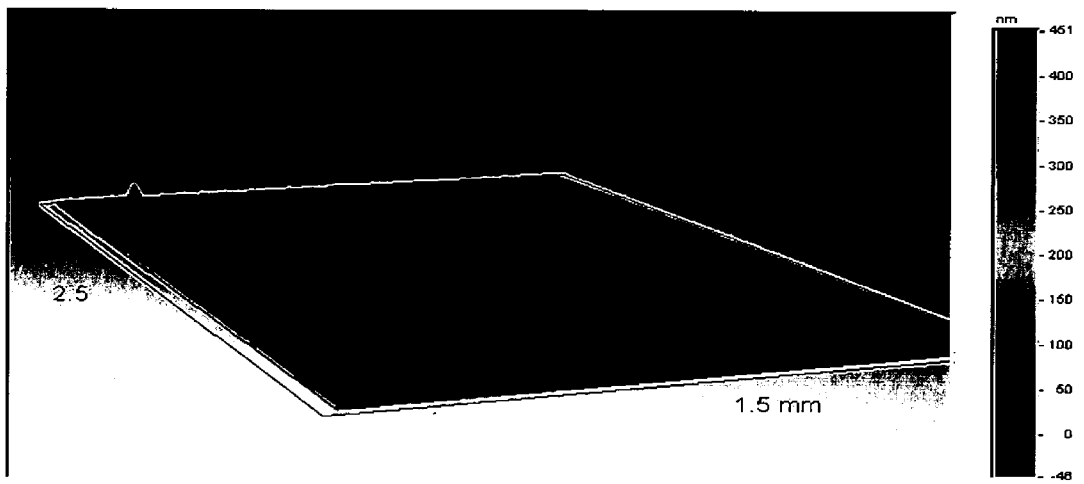
FIG. 11B is a surface profile image of a CdS film deposited by a continuous flow microreactor.
Figure 28:
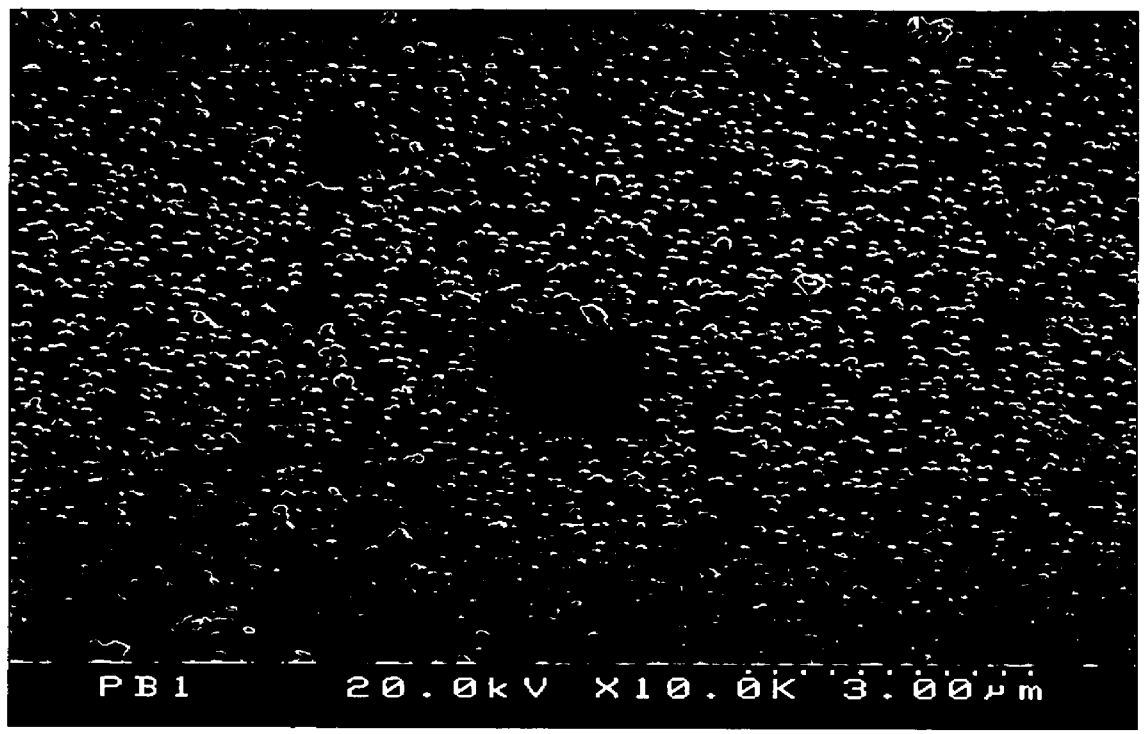
FIG. 28 is an SEM image of a CdS film deposited by a batch reactor.
Figure 29:
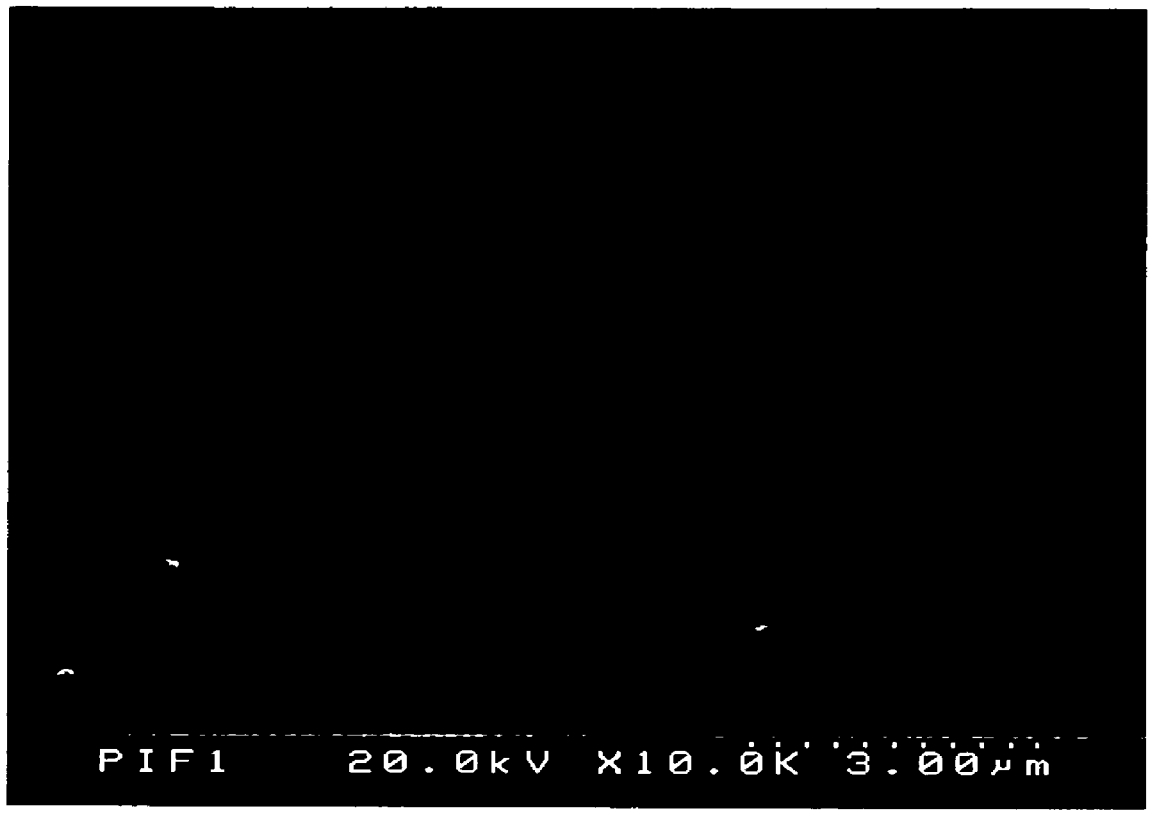
FIG. 29 is an SEM image of a CdS film deposited by a continuous flow microreactor.

Thin films deposited using embodiments of the present method and system have been characterized by AFM, TEM, XRD and 3D Dektak surface profilometry. FIG. 11 shows the surface profiler images of CdS films deposited by (a) a batch reactor and (b) a continuous flow microreactor according to the present invention. FIG. 11 demonstrates that films deposited by continuous flow microreactor systems according to the present invention are much smoother than films deposited by batch reactors. This also is demonstrated by FIGS. 28 and 29. FIG. 28 is an SEM of a CdS film deposited by a batch reactor. FIG. 29 is an SEM of a CdS film deposited by a continuous flow microreactor. FIGS. 28 and 29 demonstrate that films deposited by the continuous flow microreactor are smooth and continuous. Conversely, the batch reactor produced isolated CdS dots on the order of hundreds of nanometers in size.

Figure 12A:
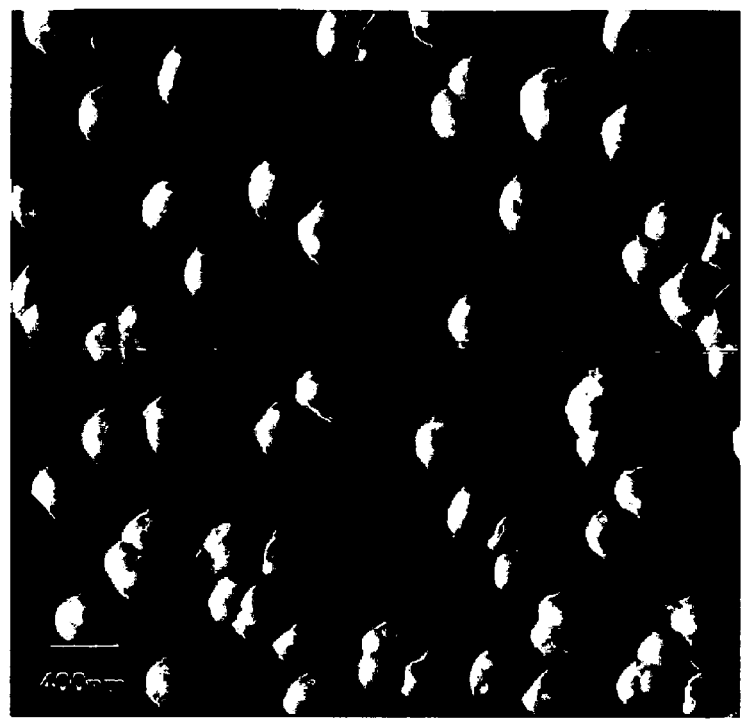
FIG. 12A is an atomic force microscopy (AFM) image of a CdS film deposited by a batch reactor.

FIG. 12 compares 2 µm×2 µm AFM scans of CBD CdS films deposited on a silicon oxidized substrate using batch and continuous flow microreactor processes. These AFM images reveal a clear difference in the appearance of the surface for samples deposited by batch processes compared to continuous flow microreactor systems. FIG. 12A shows the surface morphology of CdS deposited on an oxidized silicon substrate using a batch reactor for 3.12 minutes. FIG. 12A shows isolated groups of pyramidal CdS nanocrystals grown on top of the oxidized silicon substrate. This surface is referred to herein as a substantially discontinuous film. The sample has a root mean square (RMS) surface roughness of 19.592 nm with a mean roughness of 15.795 nm.

Figure 12B:
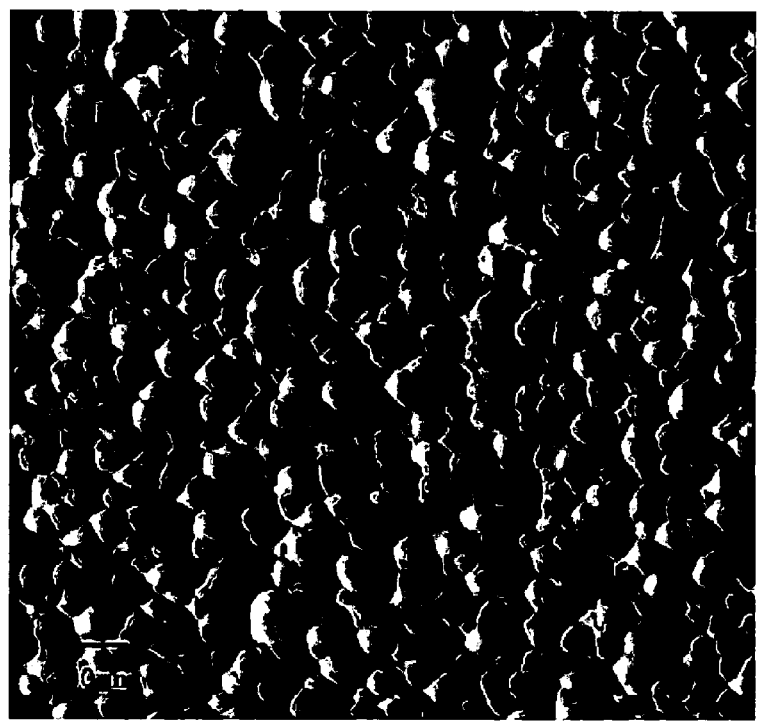
FIG. 12B is an AFM image of a CdS film deposited by a continuous flow microreactor.

FIG. 12B shows the surface morphology of a continuous flow microreactor deposited film of the same scan size (2 µm×2 µm). The AFM image shows a substantially continuous nanocrystalline film in contrast to the substantially discontinuous CdS nanocrystals produced using a batch process and the same deposition time. The RMS roughness value was found to be 11.751 nanometers with a mean roughness of 9.606 nanometers.

The reactant concentration of the batch process decreases quickly as the reaction proceeded due to homogeneous particle formation. Without being limited to a theory of operation, the continuous flow microreactor supplied a reactant flux with constant concentration that provides a higher nucleation density. This higher nucleation density made a significant difference in film coverage between the batch and a continuous flow microreactor processes.

Figure 13:
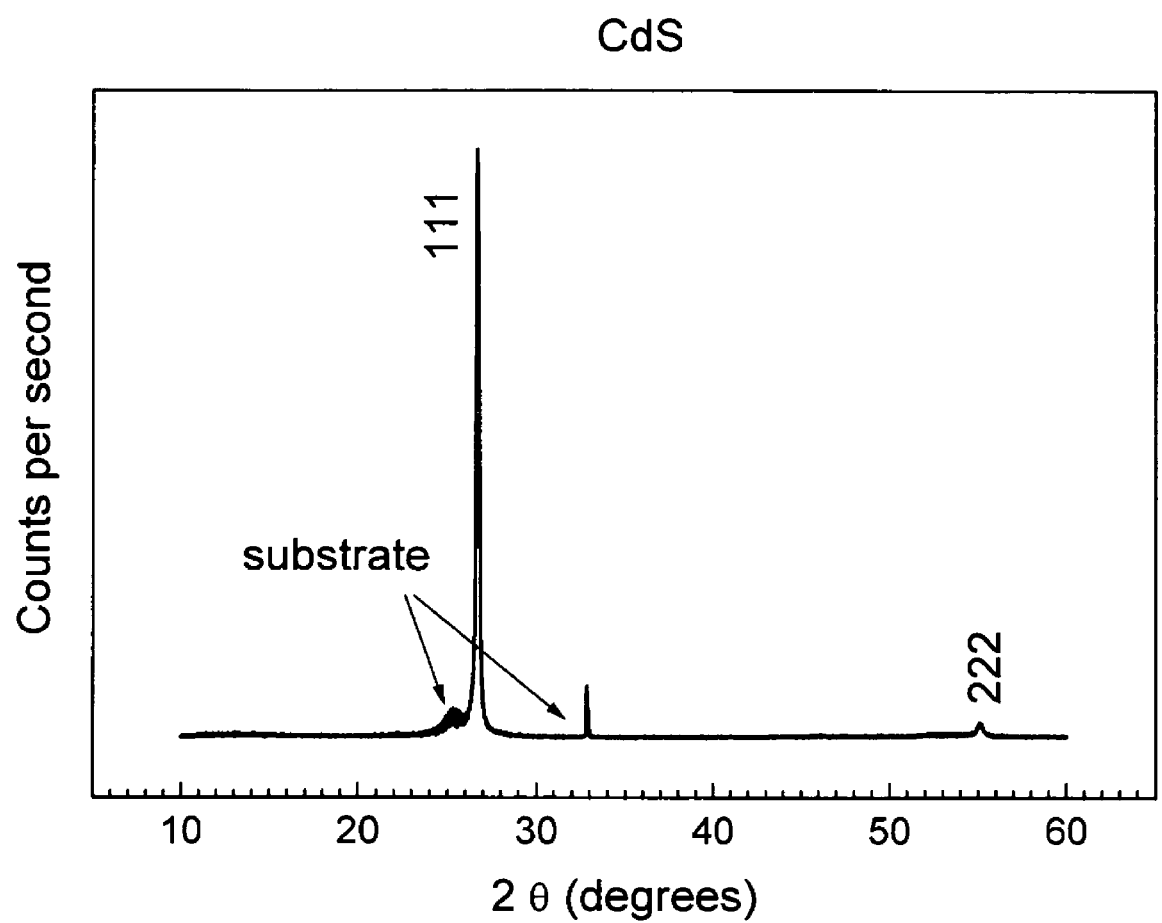
FIG. 13 is an X-Ray diffractogram (2θ, degrees versus counts per second) of CdS film deposited by a continuous flow microreactor.

A thin film (about 2,500 Å) of CdS has been deposited on a silicon coupon substrate using an embodiment of a continuous flow microreactor at a temperature of from about 85° C. to about 90° C. This CdS thin film has been characterized by XRD. FIG. 13 is a typical X-ray diffractogram, which shows diffraction peaks at 2θ=26.5° and 2θ=55°. These diffractogram peaks were compared to standards in the JCPDS data files (JCPDS card numbers: 80-0019, 75-0581, 42-1411, 75-1546). The as-deposited material appears to be composed of the cubic phase of CdS. In particular, the sharp peak at 26.50 corresponds to the (111) Bragg reflection planes from the cubic (zincblende) phase.

FIG. 13 clearly shows that the film is strongly oriented along (111) with another small peak with a (222) orientation. To test the accuracy of the result and to provide a comparison, XRD analysis also was done for the bare silicon coupon substrate. The peaks obtained for the substrate also are shown in FIG. 13. The presence of only (111) and (222) peaks is indicative of the highly oriented nature of CdS films deposited by the continuous flow microreactor. Without being limited to a theory of operation, such highly oriented CdS films likely grow as successive alternative planes composed of only Cd or S atoms parallel to the substrate surface, as it corresponds to the (111) planes of the cubic crystalline structure. This type of growth agrees well with the molecular level growth mechanism proposed by Lincot et al. [R. Ortega-Borges, D. Lincot, *J. Electrochem. Soc.*, 1993, 140, 3463.] based on the adsorption of the cadmium hydroxide species and the successive formation of the metastable complex by the adsorption of a thiourea molecule.

CdS can exist in three different crystal forms: hexagonal (wurtzite), cubic (zincblende or sphalerite) and cubic (rocksalt). The rocksalt form of CdS has been observed only at very high pressures and CBD films of this form have never been reported. The other two forms have been reported for CBD films under different conditions. The hexagonal form is thermodynamically more stable and usually occurs if the zincblende phase is heated above 300-400° C. G. Hodes, *Chemical Solution Deposition of Semiconductor Films*, Marcel Dekker, Inc., 2003. Therefore, the present invention provides a low temperature CBD process useful for forming cubic (zincblende) phase CdS.

Figure 14A:
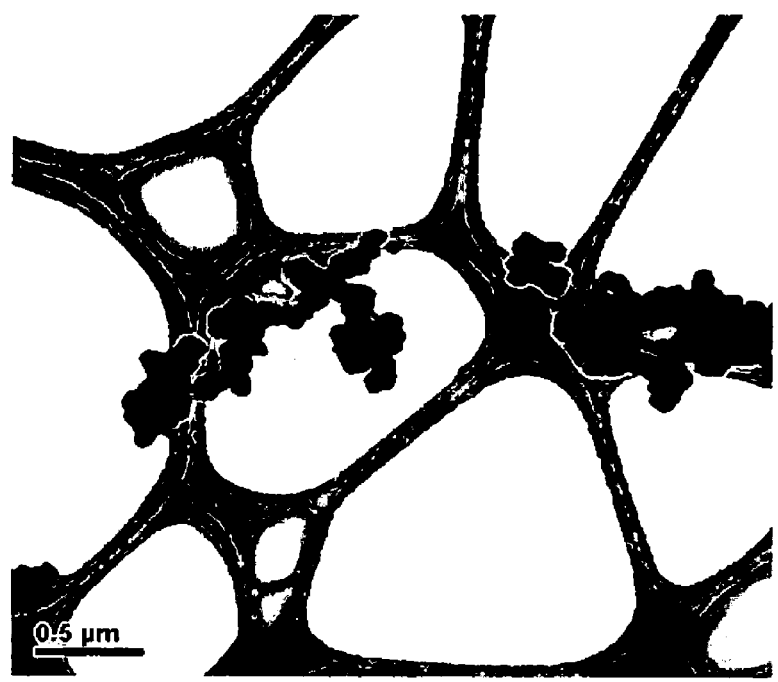
FIG. 14A is a transmission electron microscopy (TEM) image of CdS particles produced from a batch reactor with low resolution.
Figure 14B:
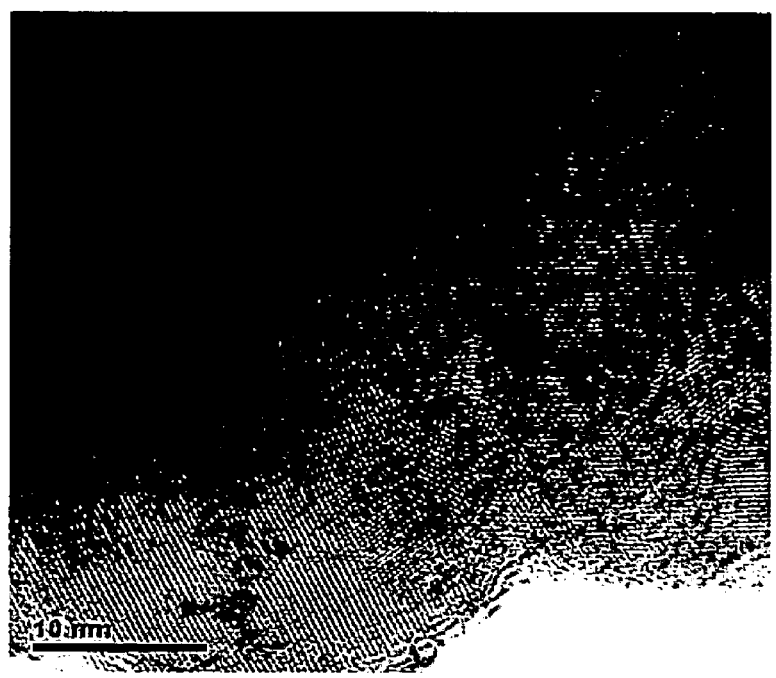
FIG. 14B is a TEM image of CdS particles produced from a batch reactor with high resolution.

The differences between batch and the continuous flow processes also were studied by TEM, SAED and EDX. FIG. 14 provides TEM micrographs of CdS particles obtained by dipping copper grids covered by thin lacey carbon films in a batch reactor solution for 10 seconds at 80° C. when the reaction time was 3.12 min. FIG. 14A shows that many agglomerates are formed with particles over 0.1 µm in size. Each of these agglomerates contains a mixture of crystalline nanoparticles on the order of 10 nanometers in diameter.

Figure 15A:
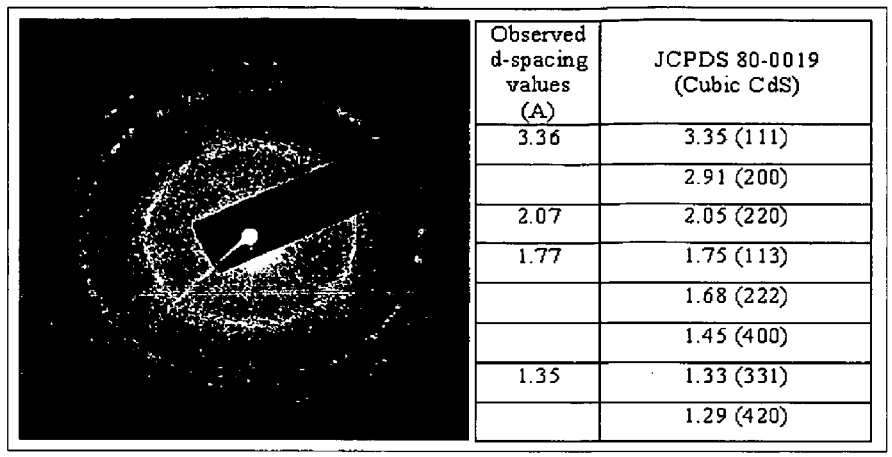
FIG. 15A is a selected-area electron diffraction (SAED) pattern of CdS particles formed using a batch reactor.

FIG. 15A provides the corresponding SAED pattern. The observed lattice plane spacing-d values agree well with the JCPDS power diffraction data for the cubic phase of CdS, which is shown in FIG. 15A as well. Also, the experimental lattice constant, a=5.87 Å, agrees well with the literature value of 5.82 A for cubic CdS phase.

Figure 15B:
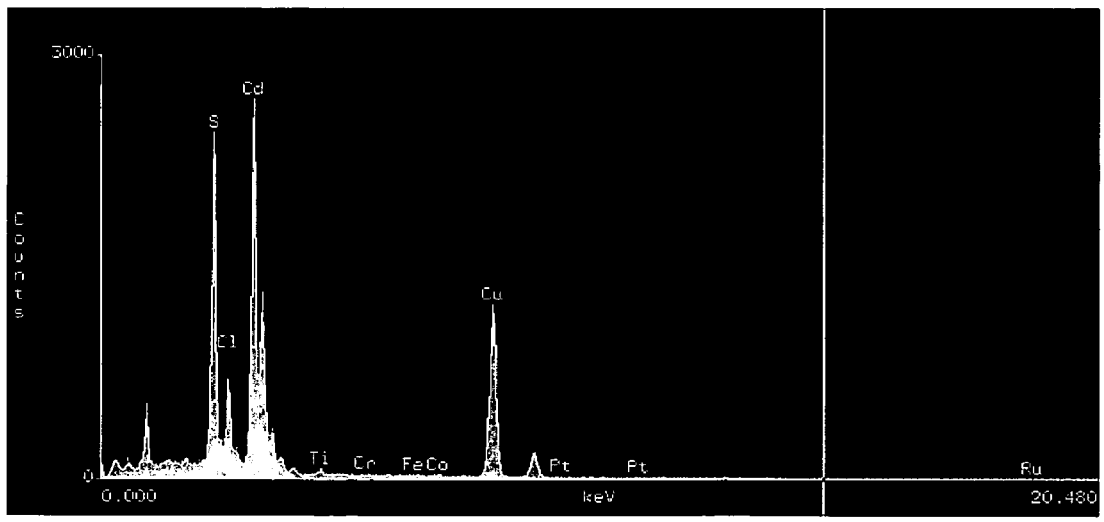
FIG. 15B is an energy dispersive X-ray (EDX) spectrum of CdS particles formed using a batch reactor.

FIG. 15B provides an EDX spectrum. The peaks of Cd and S are pronounced, with a Cd/S ratio of 43.1/56.9 atomic %. The Cl peak is due to the reagents $CdCl_2$ or $NH_4Cl$ that are used in the CBD process. The Cu peak can be attributed to copper grids used in the sample preparation process.

Figure 16:
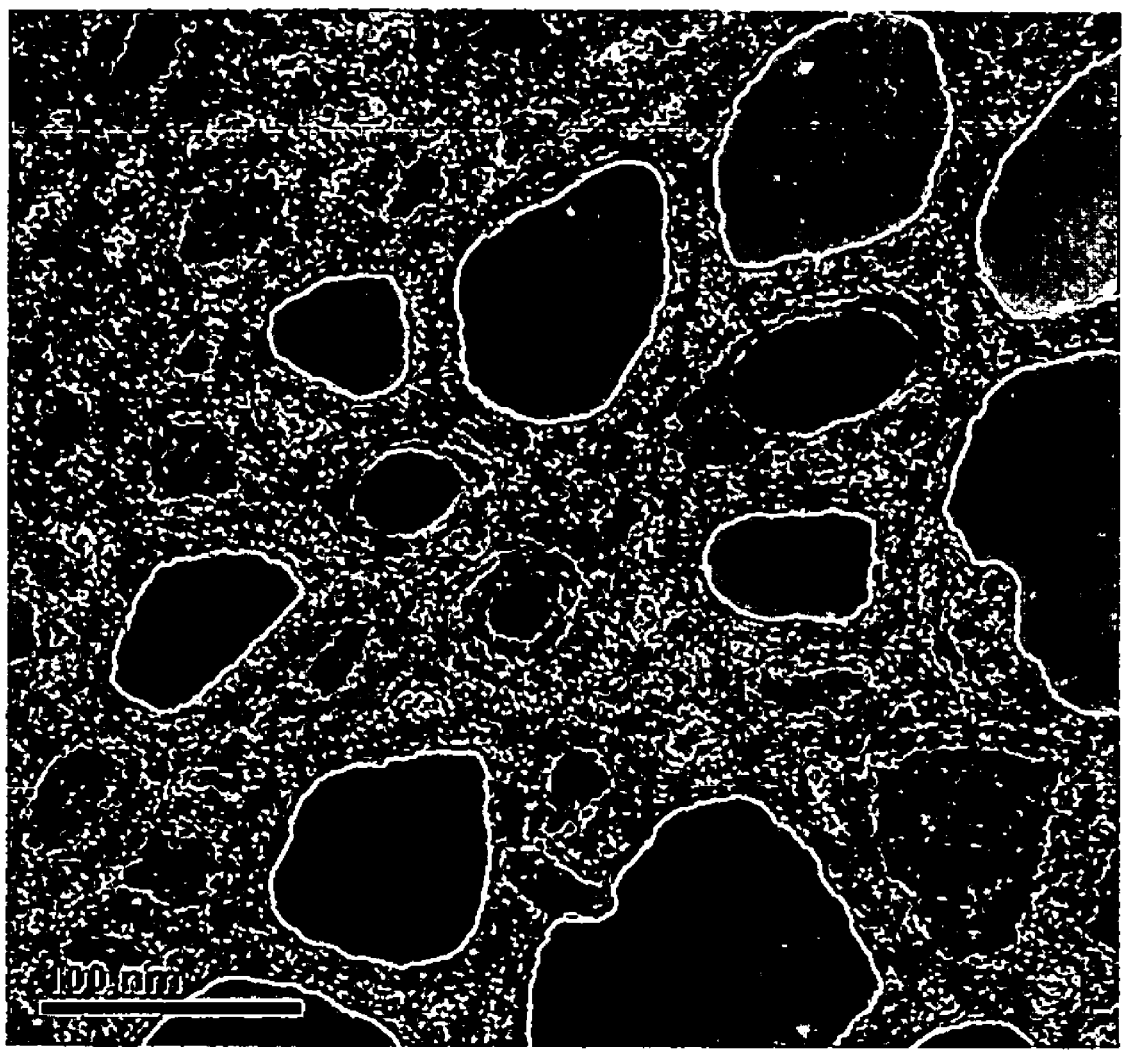
FIG. 16 is a TEM image showing the absence of CdS particles when using continuous flow microreactors.

Similarly, TEM measurements were done by dipping copper grids (with thin lacey carbon film) in hot solution, collected from the continuous flow microreactor, for about 10 seconds. There was no evidence of any particles on the surface of the grid as shown in FIG. 16. This sample had no crystallinity. Also, the EDX did not show any CdS. This result indicates that the impinging reactant flux from the continuous flow microreactor is particle free under these operating conditions. Thus, the CdS films likely were grown by a molecule-by-molecule mechanism.

Figure 17A:
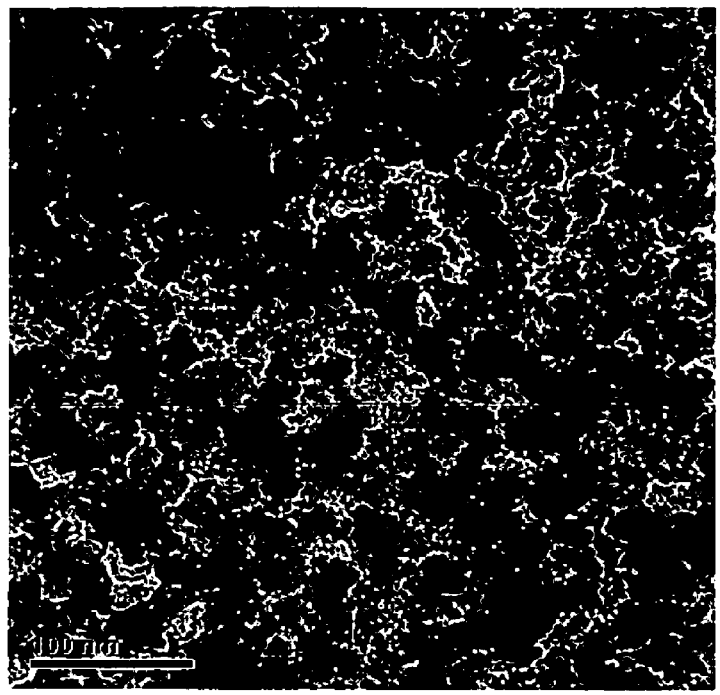
FIG. 17A is a TEM micrograph of a CdS film produced by one embodiment of a continuous flow microreactor at low resolution.
Figure 17B:
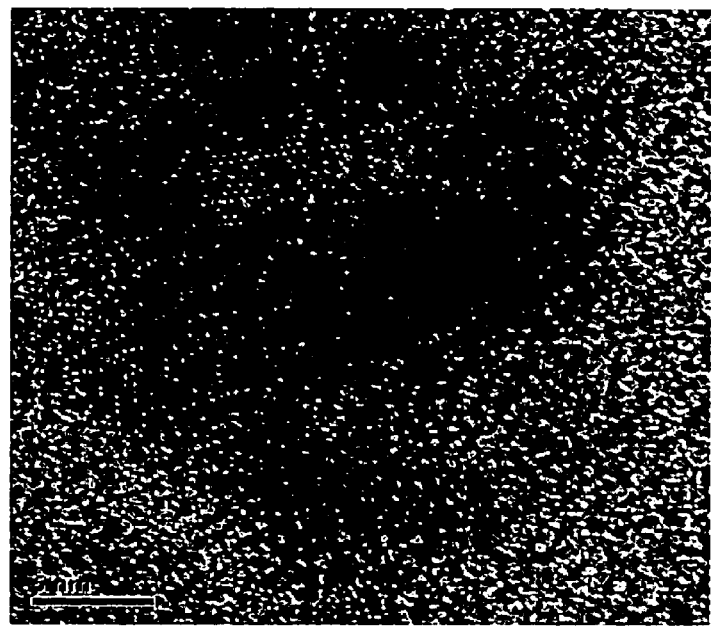
FIG. 17B is a TEM micrograph of a CdS film produced by one embodiment of a continuous flow microreactor at high resolution.
Figure 18A:
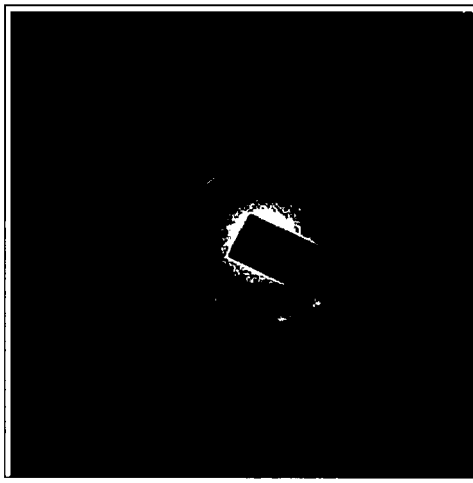
FIG. 18A is an SAED pattern of a CdS film deposited using one embodiment of a continuous flow microreactor.

A comparative study was conducted by depositing CdS film on copper grids covered with thin lacey carbon films using an embodiment of a continuous flow microreactor. The CdS coated copper grids were analyzed by TEM. FIG. 17 shows TEM micrographs of CdS film deposited using the continuous flow microreactor at 80° C. with a deposition time of 3.12 min. The distribution of small grain agglomerates can be observed and individual grains reach up to 5 nanometers in diameter as shown in FIGS. 17A and 17B. The corresponding SAED diagram (FIG. 18A) indicates the formation of a polycrystalline film that is composed of well defined rings. The measured d-spacing values agree well with the hexagonal CdS phase. Also, the experimental lattice parameters of a=4.09 Å and c=6.77 Å were reported, in good agreement with the literature values of 4.13 Å and 6.75 Å respectively.

Figure 18B:
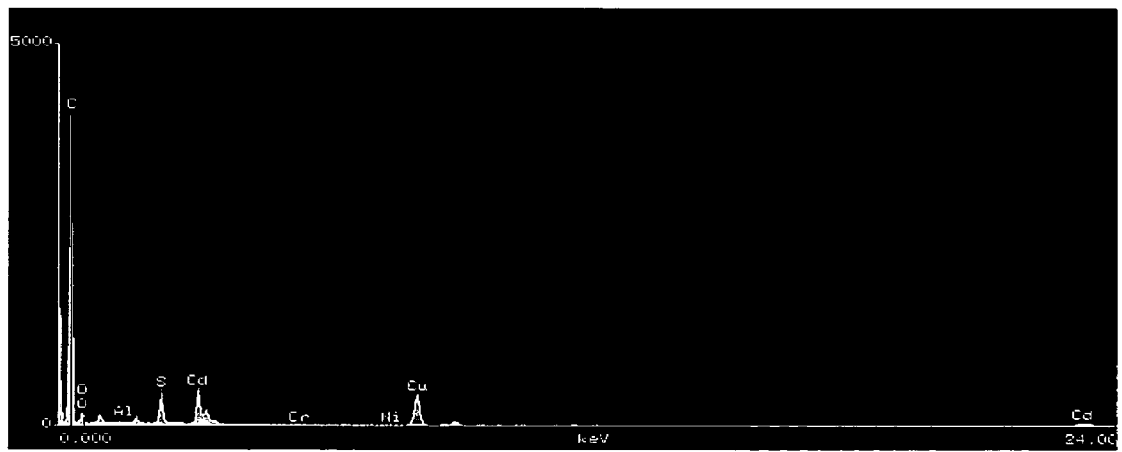
FIG. 18B is an EDX spectrum of a CdS film deposited using one embodiment of a continuous flow microreactor.

The difference in crystal structure and crystallinity from the film deposited on oxidized silicon substrate is likely a result of the lacey carbon film. The EDX spectrum for this film also is given in FIG. 18B, which shows a Cd-to-S ratio of 42.3/57.7 atomic %. Again, the Cu peak is attributable to the copper grid substrates.

Figure 19:
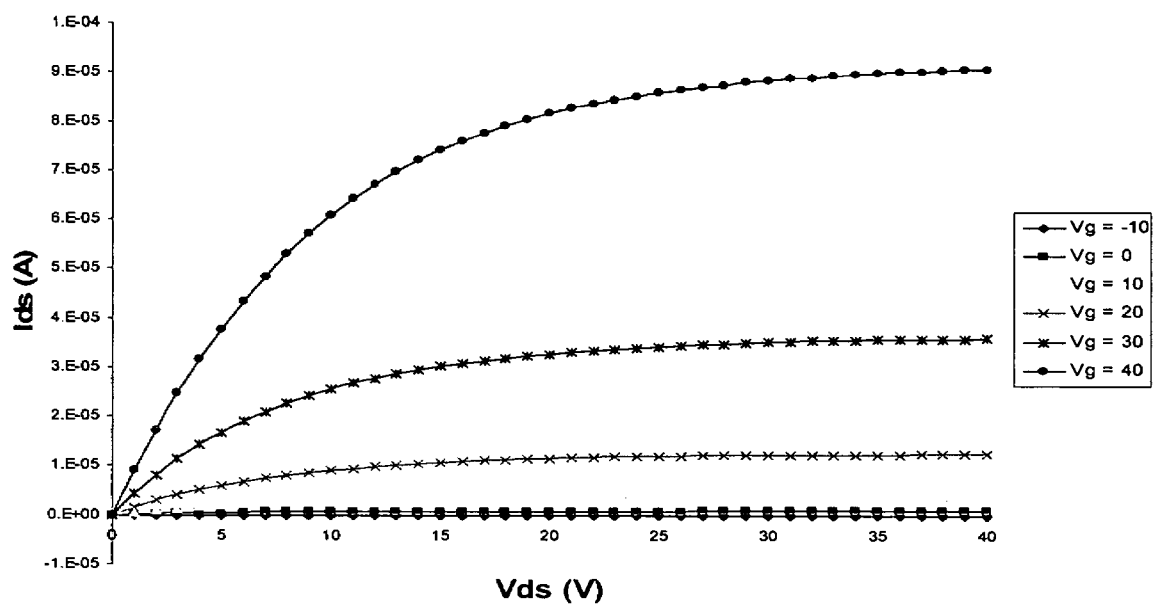
FIG. 19 is a plot of $V_{ds}$ (volts) versus $I_{ds}$ (amps) illustrating output characteristics for a CdS thin film transistor (TFT) with a $V_{GS}$=−10 to 40 V in 10 V steps, $V_{DS}$=0 to 40 V, and a channel width-to-length ratio of 12.

The TFT fabricated from a CdS active channel layer deposited by the continuous flow microreactor has a channel layer thickness of 50 nanometers, a $SiO_2$ gate oxide thickness of 100 nanometers and a channel width-to-length ratio of 12. No further post annealing process was performed on the CdS channel layer. The drain current-drain voltage ($I_{DS}$–$V_{DS}$) output characteristics for this CdS TFT are presented in FIG. 19, which shows good gate modulated transistor behavior and hard saturation. Gate currents are in the range of several nA from output characteristics, indicating that a patterned CdS channel layer successfully reduced current leakage compared to a non-patterned device. The electrical parameters used to characterize this TFT are threshold voltage, mobility, drain current on-to-off ratio, and turn on voltage. The threshold voltage is the minimum gate voltage required to produce a conductive channel, thereby enabling electrons to flow from source-to-drain. The threshold voltage for this device is approximated using a linear extrapolation method with the drain current measured as a function of gate voltage at a low $V_{DS}$ to ensure operation in the linear region. D. K. Schroder, *Semiconductor Material and Device Characterization* ($2^{nd}$ edn), John Wiley & Sons, Inc., New York 1998.

Figure 20:
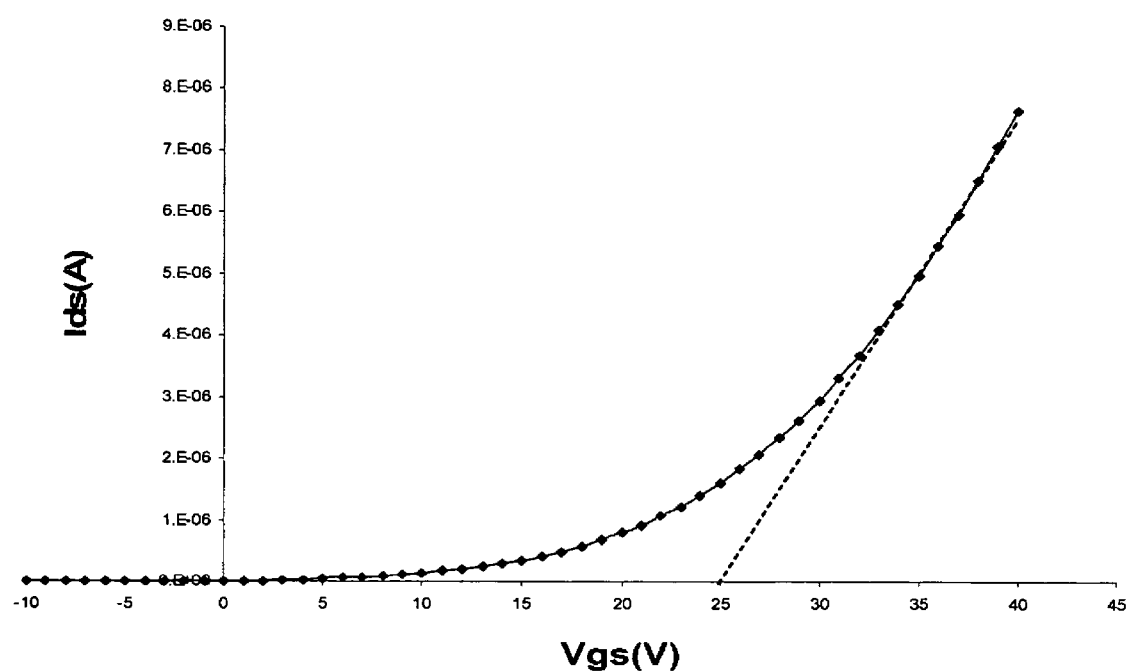
FIG. 20 is a plot of $V_{gs}$ (volts) versus $I_{ds}$ (amps) illustrating drain current-gate voltage ($I_{DS}$-$V_{GS}$) at $V_{DS}$=1 V for a CdS TFT illustrating a linear extrapolation method for threshold estimation.

FIG. 20 shows the drain current-gate voltage ($I_{DS}$-$V_{GS}$) at $V_{DS}$=1 V using the linear extrapolation method for threshold estimation, resulting in a threshold voltage of $V_T \cong 25$ V. With a positive threshold voltage, this device behaves as an enhancement-mode device that is initially off and requires a positive gate voltage to allow current to flow.

The mobility of a TFT refers to the carrier mobility that is proportional to the carrier velocity in an electric field. D. K. Schroder, *Semiconductor Material and Device Characterization* ($2^{nd}$ edn), John Wiley & Sons, Inc., New York 1998. The effective mobility ($\mu_{eff}$) is the most common reported and depends on lattice scattering, ionized impurity scattering, and surface scattering and is derived from the drain conductance. R. F. Pierret, *Field Effect Devices* ($2^{nd}$ edn), Addison-Wesley Publishing Company, Inc., 1990. The field-effect mobility ($\mu_{FE}$) is determined by the transconductance of the device at $V_{DS}$=1 V to ensure mobility extracted from the linear region. The effective mobility for one embodiment of a CdS device produced using the present invention is $\mu_{eff} \cong 1.46$ cm$^2$/V-sec and the field-effect mobility is $\mu_{FE} \cong 1.4$ cm$^2$/V-sec.

Figure 21:
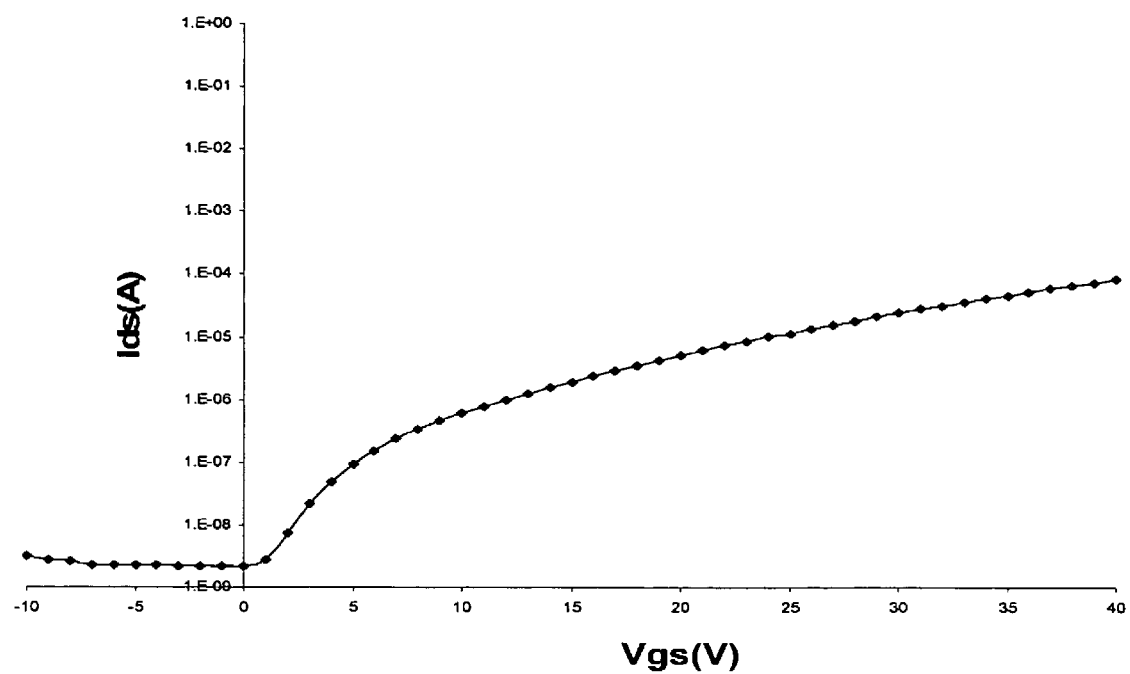
FIG. 21 is $V_{gs}$ (volts) versus $I_{ds}$ (amps) illustrating Log ($I_{DS}$)-$V_{GS}$ characteristics at $V_{DS}$=40 V for a CdS TFT showing an on-to-off ratio of approximately $10^5$ and turn on voltage at 0 V.
Figure 22:
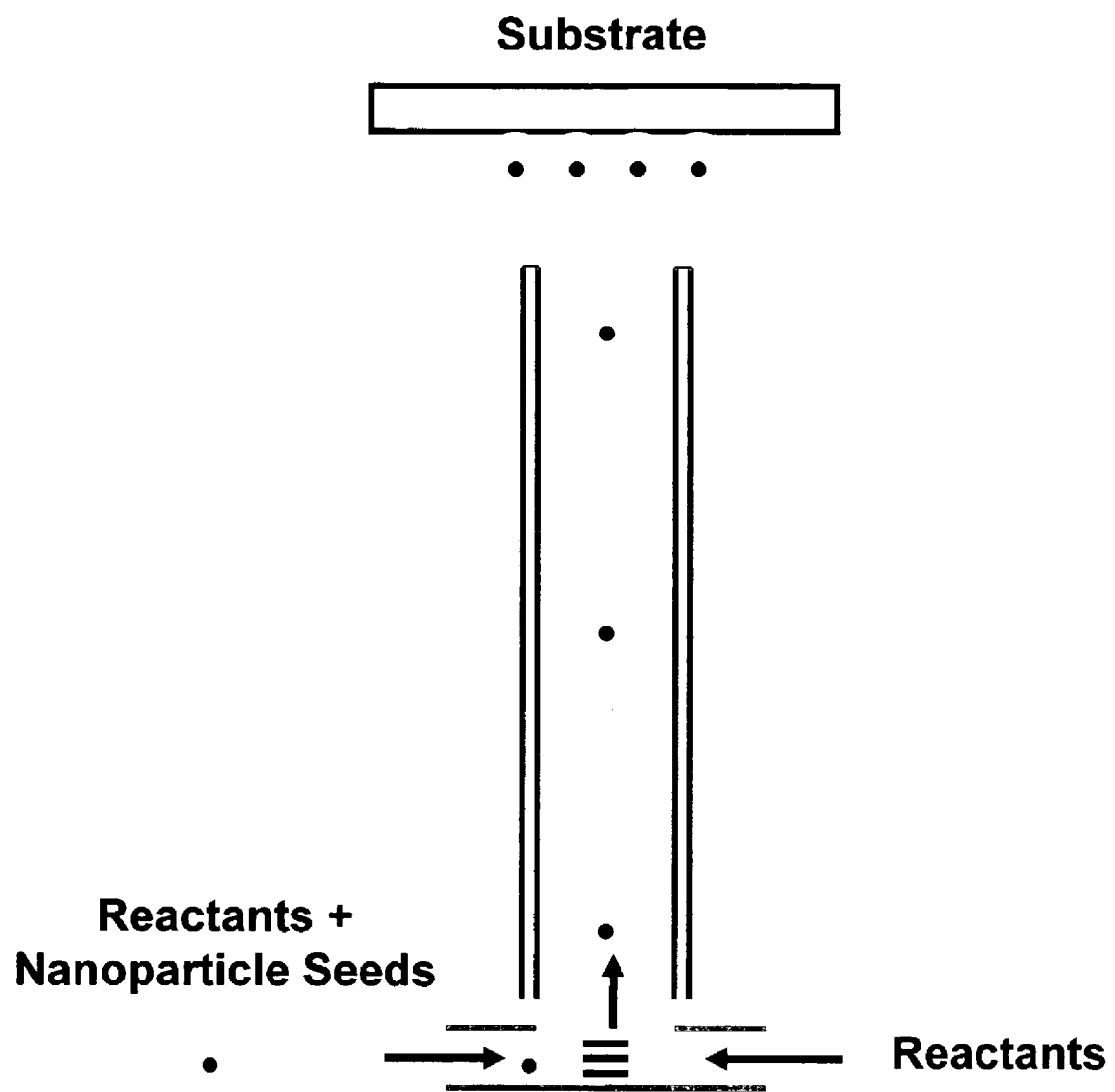
FIG. 22 is a schematic drawing illustrating application of reactants and nanoparticle seeds to a substrate.

The drain current on-to-off ratio determines the switching quality of the TFT. FIG. 21 shows the Log($I_{DS}$)-$V_{GS}$ transfer characteristics at $V_{DS}$=40 V, showing a drain current on-to-off ratio of approximately $10^5$ and turn on voltage at 0V.

This enhancement-mode CdS TFT with a CdS channel layer deposited by the continuous flow microreactor at low temperature (80-90° C.) shows an effective mobility and a field-effect mobility higher or close to the previous reported data. All previous reported CBD CdS TFTs employed a post-annealing process such as 400° C. vacuum annealing in $N_2$ ambient for 3-6 minutes; 200° C. vacuum annealing for 30 minutes; 300° C. in air for one hour; and 500° C. rapid thermal annealing in argon for 5 minutes. Embodiments of the presently disclosed invention provide a process for fabricating TFTs on low cost flexible polymeric substrates at low temperatures by, for example, avoiding the post annealing processes required for known TFTs.

Thus, the present application describes a continuous flow microreactor useful for chemical bath deposition processes. Films of materials, such as CdS, ZnO and In$_x$O were deposited by conventional batch CBD reactor from heated solutions and also by CFM with heated substrates. Various characterization results showed that CFM deposited films were more uniform and of better quality than the batch deposited films.

Using an interdigital micromixer achieves efficient mixing of the reactant streams in a short time period. This reactor introduces constant reactant flux to the system (continuous process) that allows controlling the homogeneous reaction of the chemical bath solution before the solution impinges on the substrate. A reactant flux that is substantially particle free has been produced by controlling the residence time. Using this particle-free flux, molecule-by-molecule heterogeneous growth mechanism has been promoted to substantially prevent particle-by-particle growth. In this way, unwanted deposition on the walls of the vessels and the homogeneous CdS formation in the chemical bath is minimized. Furthermore, the continuous process minimizes waste production, which leads to more uniform films with negligible occurrence of pinholes.

Enhancement-mode CdS TFTs were fabricated using this continuous flow microreactor at low temperature (80-90° C.) without post-deposition annealing. An effective mobility, $\mu_{eff} \cong 1.46$ cm$^2$/V-sec and a field-effect mobility, $\mu_{FE} \cong 1.4$ cm$^2$/V-sec that is higher or close to the previous reported data were obtained from this device. This new approach can be adopted for low-temperature deposition of other compound semiconductor thin films using solution-based chemistry with improved control over processing chemistry and minimum waste production.

Disclosed embodiments of the present invention provide many benefits relative to batch CBD processes. For example, thin films deposited using embodiments of the present method and system are substantially more continuous, and generally have a higher crystallinity, than do thin films deposited by batch processes. Post annealing steps required with batch processes, which are obviated with the present invention, may reduce the porosity of the deposited materials and increase the crystallinity. However, films deposited using the present invention typically are less porous, and often have higher crystallinity, relative to batch processes even without a post deposition annealing step.

Moreover, the present invention provides a more reliable and reproducible deposition result. For batch processes, it is not unusual to make plural deposition attempts to obtain a suitable deposited layer. The occurrence of unsuitable deposition layers is significantly reduced using disclosed embodiments of the present method and system.

The present invention also provides a higher deposition rate than batch processes at the same deposition material concentration. To obtain a deposited layer having a suitable thickness, batch CBD processes often will use plural deposition baths to deposit a single layer. The longer a substrate is immersed in a deposition bath, the more likely it is that deleterious particle formation and deposition will occur on the substrate. This unwanted particle formation and deposition can be minimized in batch processes by moving the substrate from deposition bath to deposition bath, and immersing the substrate in a particular deposition bath for a time selected to minimize particle formation. However, the longer the substrate remains in the deposition bath, the slower the deposition rate is since the reactant concentrations are decreasing. All of these process deficiencies are addressed by using disclosed embodiments of the present invention.

EXAMPLES

Working examples are provided to illustrate particular features of the disclosed embodiments. The scope of the present invention should not be limited to the features exemplified by these working embodiments.

Example 1

Chemical Deposition

Oxidized silicon substrates (silicon wafer coupons) measuring 15×10 mm were used for deposition studies. The coupons were initially sonicated in an ultrasonic bath using 1 M NaOH for about 10-15 min. and then cleaned according to a standard AMD (Acetone, Methanol, DI water) procedure. Finally, they were dried under a stream of nitrogen gas before being used for deposition.

A CBD batch reactor was used, consisting of an 800 ml glass beaker mounted on top of a VWR hotplate stirrer. Substrates were taped on to a 75×25 mm commercial glass slide after cleaning by the AMD procedure and immersed in 436 ml. of Millipore DI water in the beaker. $CdCl_2$ (0.004M) and $NH_4Cl$ (0.04M) were added slowly with stirring and the temperature of the reaction mixture was monitored using a thermometer. When the temperature reached 80° C., thiourea (0.04M) was added, which decreased the temperature. Heating was continued until the reaction mixture again reached 80° C. and $NH_4OH$ (0.4M) was then added to initiate the reaction. The reaction was allowed to proceed for a defined period of time. The substrates were then taken out of the solution, removed from the glass slide, washed with DI water and dried under a nitrogen stream.

The continuous flow microreactor used consisted of two syringe pumps and a micromixer connected using PEEK tubes (1/16" OD, 0.03" ID from Upchurch Scientific) as shown in FIG. 2. Two 25 milliliter syringe pumps (V6 module from Kloehn Ltd.) were used. Reactant streams A and B initially were pumped into syringes and then dispensed through the PEEK tube and allowed to mix in the micromixer. Stream A was 24 ml of $CdCl_2$, $NH_4Cl$, $NH_4OH$ and de-ionized water. Stream B consisted of a total of 25 ml of thiourea and de-ionized water. The overall reactant concentrations were 0.004M $CdCl_2$, 0.04M $NH_4Cl$, 0.04M thiourea and 0.4M $NH_4OH$. Mixture flowing from the micromixer passed through a 5' long coil (PEEK), kept immersed in a hot water bath maintained at 80-85° C. (using VWR hot plate stirrer). The solution was impinged on a substrate, taped to a 3" dia. SS metallic plate and heated on a hotplate (2" dia.×0.75" thick SS disk from Watlow) at 80-90° C. The syringe pumps were operated at a speed of 250 steps/sec. (Hz) and the mean residence time of the mixture was about 5 sec. Once the process was completed, the substrate was removed from the plate, washed with Millipore DI water and dried under a stream of nitrogen gas.

Example 2

Film Characterization

Both batch reactor and continuous flow microreactors were used for depositing CdS. The CdS thin film morphology was characterized by atomic force microscopy (AFM) using a DI Nanoscope III in contact mode, scanning electron microscopy (SEM) using a Hitachi S-4100 FE-SEM with a cold field emission electron gun and a Dektak 8 stylus profilometer. The phase and crystalline orientation was determined by X-ray diffraction (XRD) using a Siemens D-5000 X-ray diffractometer with Cu Kα radiation. Finally, to study the particle formation, transmission electron microscopy (TEM) was used, along with selected area electron diffraction (SAED) and energy dispersive X-ray (EDX) analysis. To prepare samples for the batch reactor, drops of CBD solution were taken out of the beaker at specified time intervals and loaded onto copper grids covered with a thin film of lacey carbon kept on a glass slide. Filter paper was used to absorb fluid through the bottom of the grid. To prepare samples for CFM, the copper grids were taped onto glass slides and the deposition was done using impinging flow for different periods of time.

Example 3

CdS MISFET Fabrication

For CdS MISFET fabrication, a heavily boron (p+) doped silicon substrate served as the gate in an inverted-gate structure was used. Silicon dioxide with thickness of 100 nm was thermally grown on top of a silicon substrate and a 500 nm gold layer for gate contact was sputtered on the backside of Si substrate. The semiconductor channel material was patterned in order to reduce the gate leakage current. To do this, around 1 μm thick positive photoresist was first spun on Si substrate following by a photolithography process. A ~50 nm CdS thin film was deposited on top of the $SiO_2$ by the continuous flow microreactor with overall reactants concentration at 0.004 M of $CdCl_2$, 0.04 M of $NH_4Cl$, 0.04 M of Thiourea and 0.4 M of $NH_4OH$. After the deposition, the sample was immersed into an acetone solution and gently agitated to remove the photoresist and lift-off the additional CdS layer. The sample was removed from the solution, washed with DI water and dried under a stream of nitrogen gas. No further post annealing process was performed. 300 nm aluminum source and drain contacts were then evaporated on top of CdS layer through a shadow mask with channel width-to-length ratio of 7 and 12 to complete the process of fabricating CdS Metal-Insulator-Semiconductor Field Effect Transistors (MISFETs). A schematic cross-sectional view of the CdS MISFETs structure is shown in FIG. 10.

Example 4

Indium Oxide TFT

An indium oxide thin film was deposited using 0.03 M $InCl_3$ dissolved in acetonitrile solvent and pumped through a microprocessor-controlled dispensing pump (ISMATEC® pumps). The solution passed through a micro-tube and impinged on a heated substrate that was maintained at 70° C.

Figure 23:
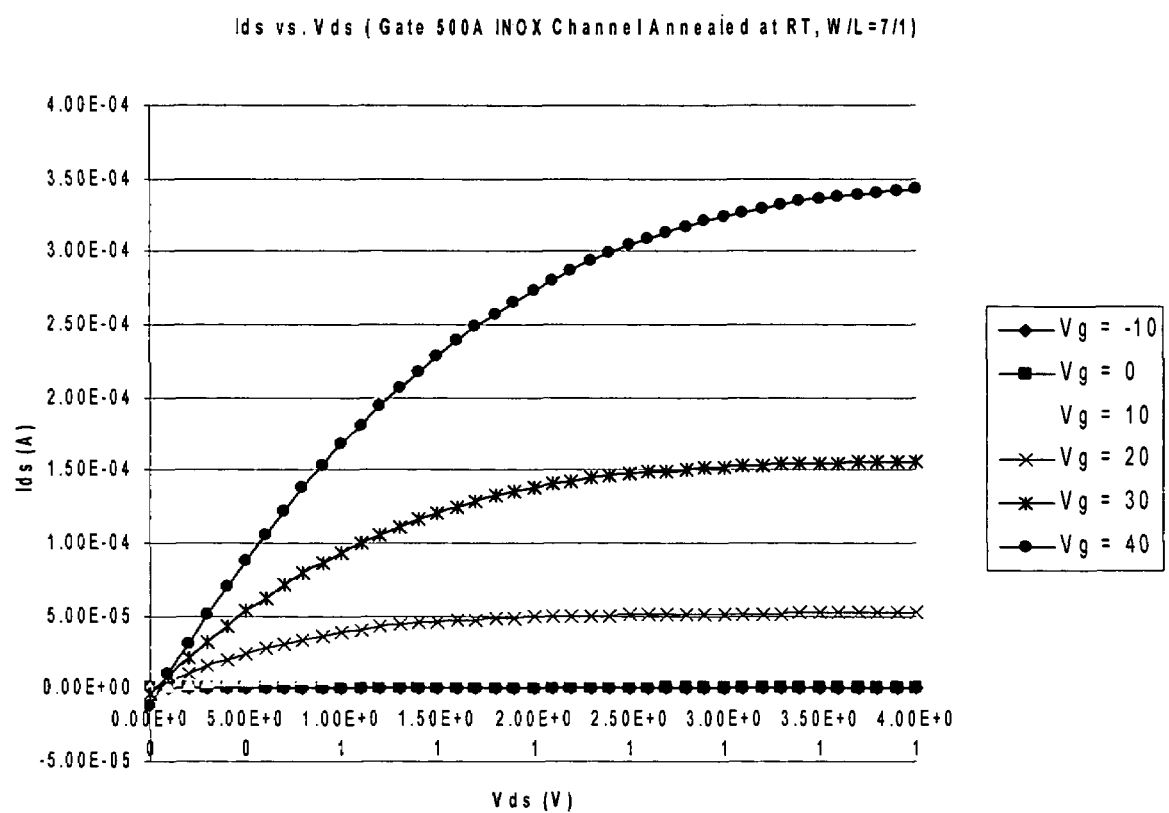
FIG. 23 is a plot of $V_{ds}$ (volts) versus $I_{ds}$ (amps) illustrating output characteristics for an $InO_x$ TFT.
Figure 24:
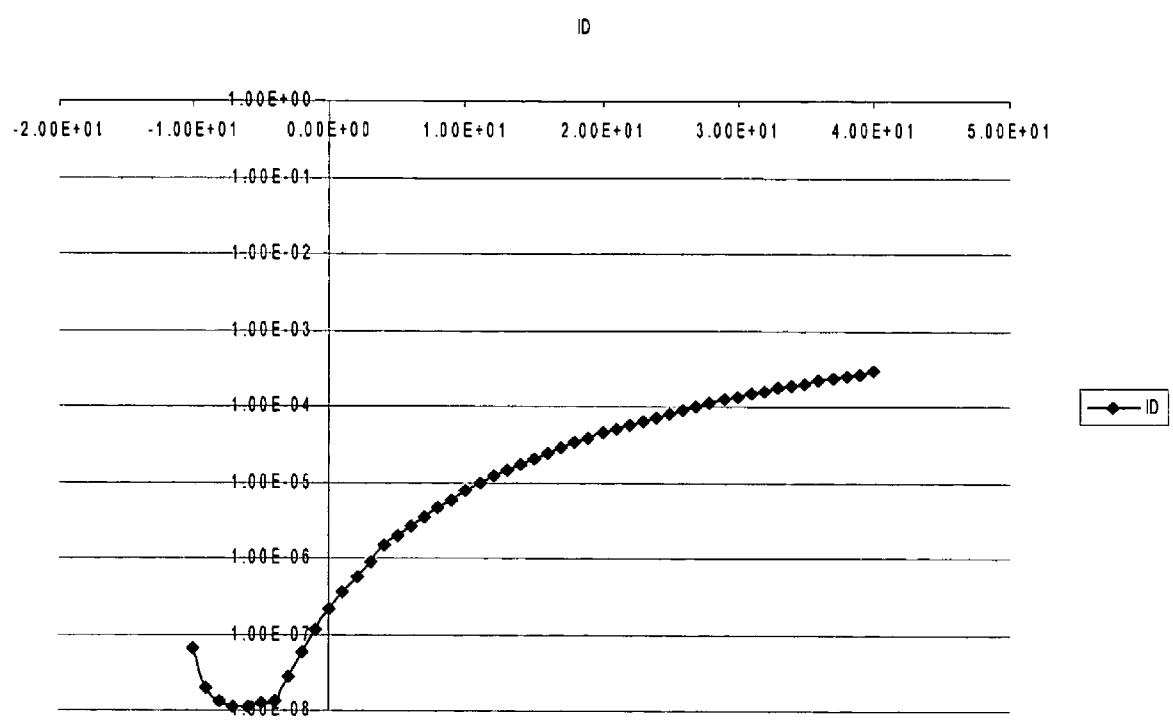
FIG. 24 is $V_{gs}$ (volts) versus $I_{ds}$ (amps) illustrating Log ($I_{DS}$)-$V_{GS}$ characteristics at $V_{DS}$=40 V for an $InO_x$ TFT showing an on-to-off ratio of greater than $10^4$ and turn on voltage at −6V.

A working thin film transistor was fabricated from an indium oxide film that was deposited for 2.5 minutes. As shown in FIGS. 23 and 24, the device has a field effect mobility of 2.1 cm2/V.s, a turn on voltage (Von) at −6 V, and a current on/off ratio of 104.

Example 5

Batch Process Comparison Example

A CBD batch reactor used for this example includes a 1000 milliliter beaker, a sample holder, a thermometer, a quartz crystal microbalance (QCM) probe (Maxtex PM 710) and a magnetic stir bar. The reactor was placed on top of a VWR Oyla-Dual heater and magnetic stirrer. The stirring rate was set at about 200 rpm and the temperature was maintained at 80° C. with a pH of ≈11. The CdS film thickness was monitored using a QCM probe.

For device fabrication, a heavily antimony-doped silicon substrate served as the gate in an inverted-gate structure. A silicon dioxide layer having a thickness of about 100 nanometers was grown thermally on top of a silicon substrate and a 500 nanometer gold layer for gate contact was sputter deposited on the backside of a Si substrate. A 200 nanometer CdS thin film was deposited on top of the $SiO_2$ by CBD with 0.004 M $CdCl_2$, 0.04 M thiourea, 0.04 M $NH_4Cl$ and 0.4 M $NH_4OH$. A two-step rapid thermal annealing (RTA) process was performed in an argon atmosphere before and after evaporating a 300 nm aluminum source and drain contacts for 5 minutes at 500° C. The first anneal improves the CdS crystallinity of the semiconductor layer. The second anneal forms a good source and drain and ohmic contact between the aluminum and CdS layer.

To study particle formation, solutions were taken from the CBD CdS reactor using a micropipette 5 and 10 minutes after reaction occurred and then dropped onto $SiO_2$/Si substrates. After 3 minutes, a micropipette was used to remove the solution.

The CdS thin-film morphology and structure were characterized by scanning electron microscopy (SEM) and transmission electron microscopy (TEM), respectively. The optical bandgap of CBD CdS thin films was estimated by UV-Vis absorption. The average resistivity for as-deposited CBD CdS thin films on glass slides was measured in the dark using a four-point probe at room temperature. All the TFT testing was performed in the dark at room temperature with an HP 4156B semiconductor parameter analyzer.

Figure 25A:
FIG. 25A is an SEM image of a CdS channel layer made by a batch CBD process.
Figure 25B:
FIG. 25B is an SEM image of an aluminum source and drain electrode contact layer with the CdS channel layer of FIG. 25A made by a batch CBD process.
Figure 25C:
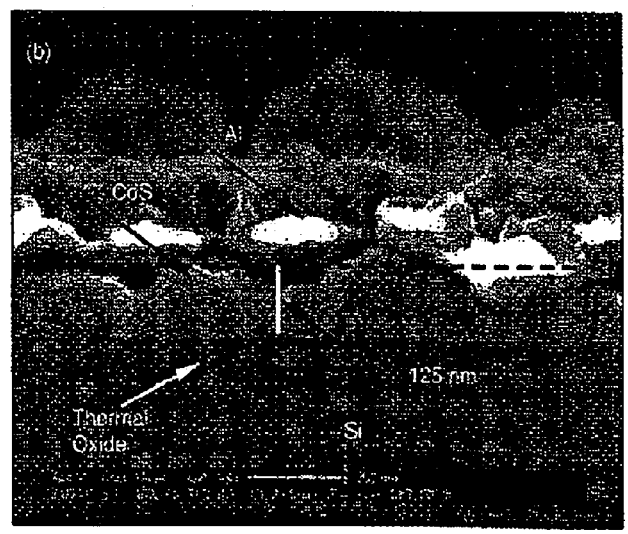
FIG. 25C is a SEM image of an aluminum source and drain electrode, CdS channel layer and thermal oxide material formed according the embodiment of the present invention.

The CBD CdS thin films were characterized by TEM, UV-Vis absorption, XPS and four-point probe to determine structural, optical, chemical and electrical properties. An SEM image that indicates the analysis position for a typical CdS TFT after focused ion beam (FIB) sample preparation is shown in FIG. 25, where (a) indicates the CdS channel layer and (b) indicates the Al source and drain electrode contact layer. The top and cross-sectional SEM images of these layers also are shown. The SEM images indicate that the CBD CdS channel layer grown under current conditions is dominated by a particle growth mechanism.

Figure 26A:
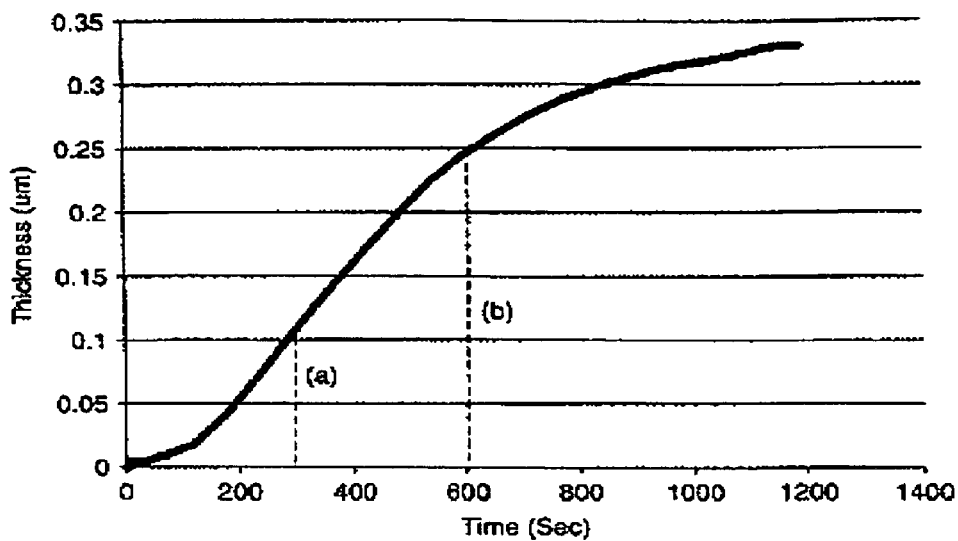
FIG. 26 is a QCM growth curve for a CDB CdS batch process, with FIGS. 26A 26B, and 26C being the corresponding AFM micrographs of the CDS particles taken from the CBS solution.

FIG. 26 shows the corresponding real-time QCM growth curve. The QCM curve indicates that the CBD CdS film started with a linear growth regime (molecule-by-molecule) and then changed to faster particle sticking growth after 100 seconds. The CBD CdS film shown in the SEM image (FIG. 25) has been grown for 8.5 minutes (which is well within the particle sticking growth regime) before being removed from the bath. Both SEM and QCM analysis suggest that the CBD CdS thin films grown under these conditions are dominated by a particle sticking mechanism.

Figure 26B:
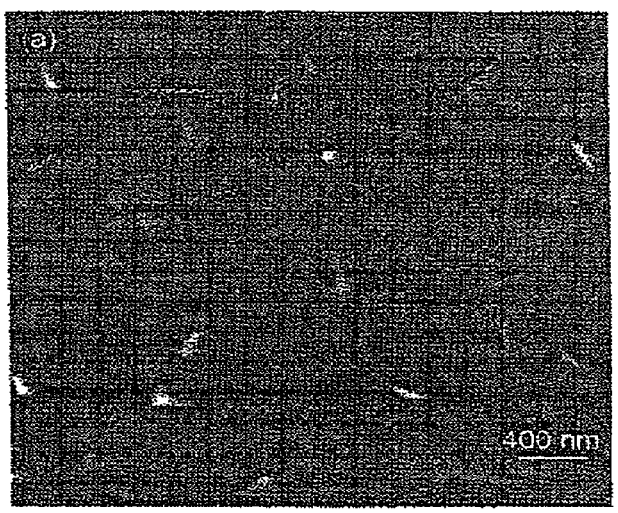

Tapping mode AFM was used to characterize the formation of the homogeneous particle formation responsible for the colloidal sticking growth mechanism. The AFM images of particles taken from the solution 5 and 10 minutes after the reaction started are given in FIGS. 26B and 26C, respectively. FIG. 26B shows an AFM image of the sample prepared from the CBD solution 5 minutes after the reaction started. A number of rod-shaped crystals could be identified clearly, in addition to smaller round-shaped particles. The rod-shaped crystals were formed most likely through a crystallization process of unreacted thiourea when the solvent evaporated.

Figure 26C:
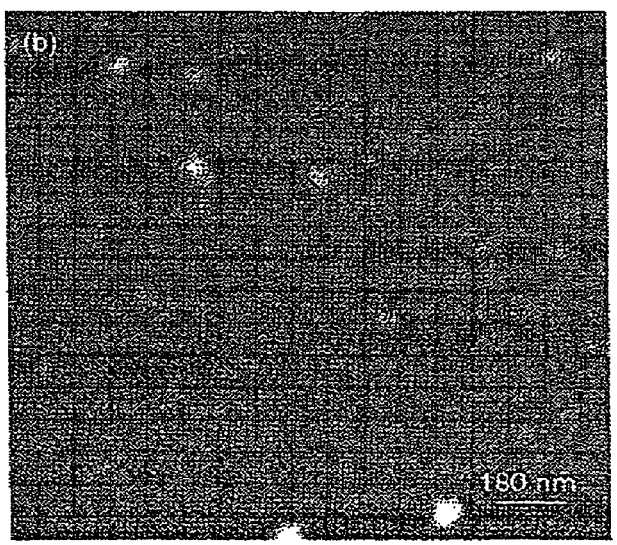

FIG. 26C shows an AFM image of the sample prepared from the CBD solution 10 minutes after the reaction started. A large number of round-shaped (CdS) particles could be identified clearly and the rod-shaped thiourea crystals could no longer be observed. This data indicates that round-shaped CdS particles were growing at the expense of consuming sulfur from thiourea.

Figure 30:
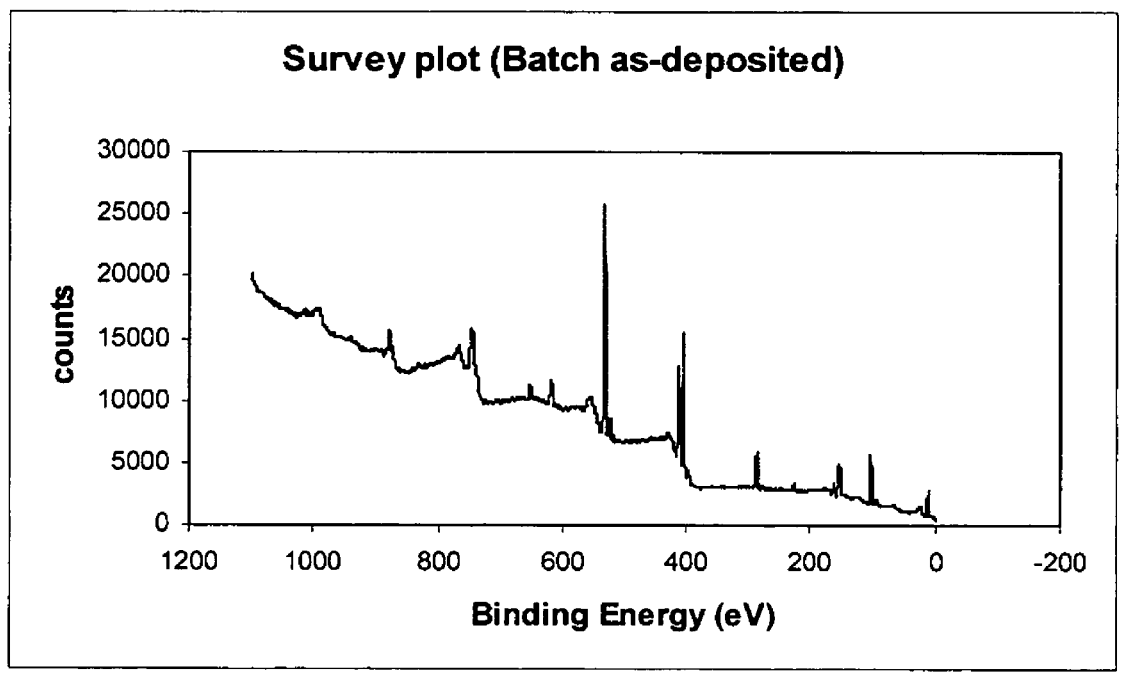
FIG. 30 is an x-ray photoelectron spectrum (XPS) of a CdS film deposited by a batch reactor.
Figure 31:
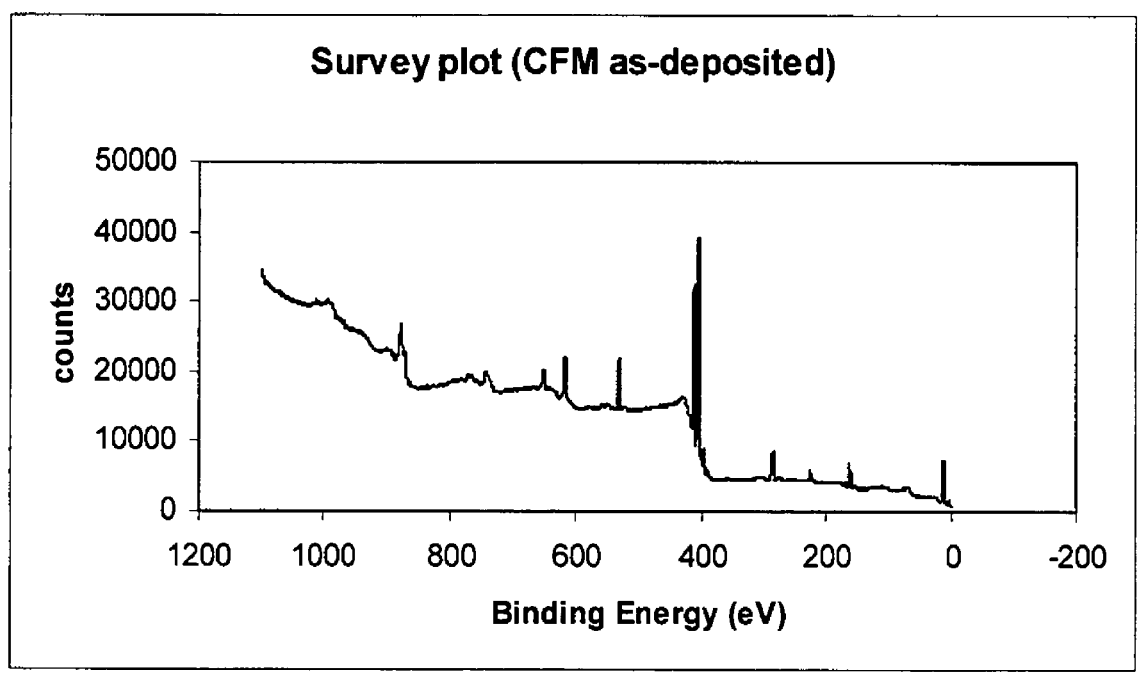
FIG. 31 is an XPS spectrum of a CdS film deposited by a continuous flow microreactor.
Figure 32:
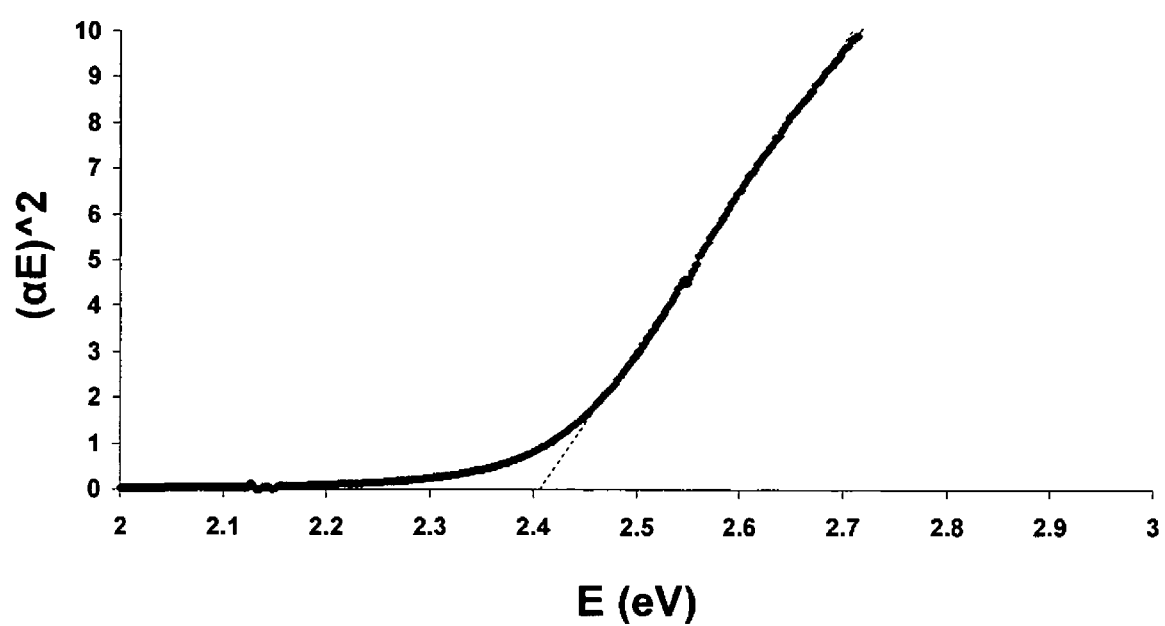
FIG. 32 provides information concerning optical bandgap for a CdS thin film deposited by a batch reactor.
Figure 33:
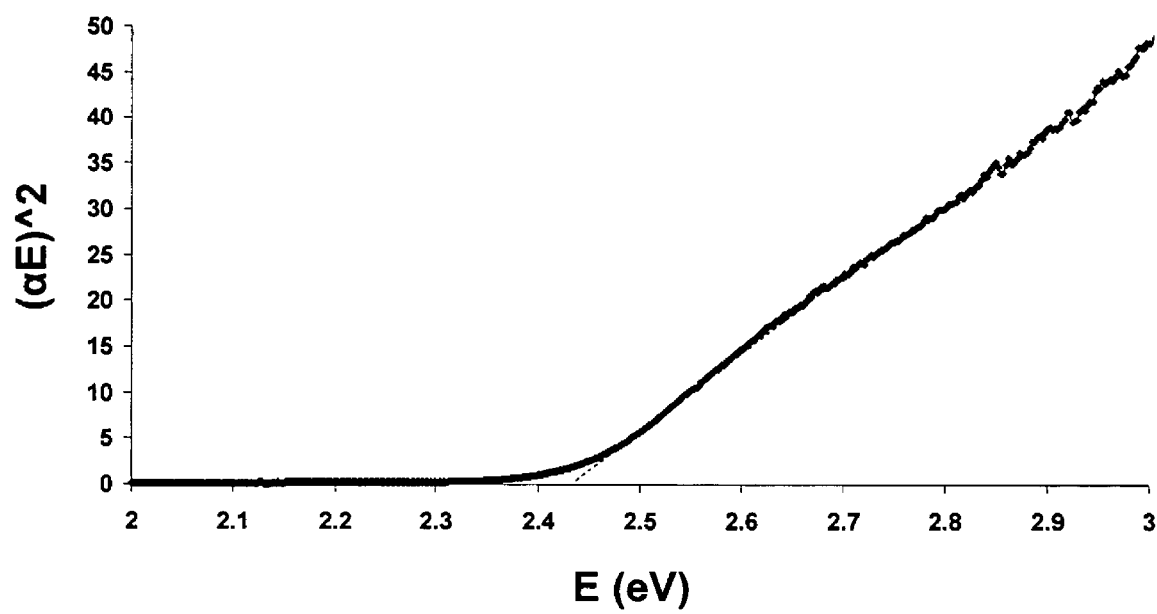
FIG. 33 provides information concerning optical bandgap for a CdS thin film deposited by a continuous flow microreactor for comparison to the bandgap for a CdS thin film deposited by a batch reactor.

The CdS layers deposited by batch and impinging flow reactor were analyzed by XPS. See, FIGS. 30 and 31. The XPS spectra for CBD CdS were typical for CdS films reported by other researchers. The binding energies of Cd $3d_{5/2}$ and Cd $3d_{3/2}$ at ~405.2eV and ~411.9 eV and that of S 2p at ~161.5 eV for the films were indicative of the CdS chemistry. An important observation was the presence of carbon and oxygen as impurities in the as-deposited and annealed films. The carbon peak, present in these samples, was of little informational utility since it is present as an impurity in all the samples exposed to atmosphere. The energy scale was calibrated using this carbon peak (C 1s at 284.8 eV) as a reference. The O 1s line possesses a rather narrow bandwidth and symmetric shape and is an indication of the presence of some oxidation products on the surface of the film. After annealing, a concentration of chloride species was observed in the XPS spectrum of IFR produced CdS film. The chlorine concentration in annealed films could be attributed to the reagents $CdCl_2$ and/or $NH_4Cl$ used for the preparation of CdS layers by CBD and the Cl 2p peak position at ~199 eV corresponds to Cl bonded as $CdCl_2$. The Si 2p peak in the batch produced (annealed) film at binding energy of 103.2 eV suggests $SiO_2$ and is more likely due to the presence of pinholes in the film. XPS data for as-deposited CdS films and associated Binding Energy (eV) peaks (in good agreement with literature values), are provided below in Table 1.

TABLE 1

| Photoelectron peak | Binding energy (eV) | | |
| --- | --- | --- | --- |
| | Batch | CFM | Lit. Values |
| Cd $3d_{5/2}$ | 405.2 | 405.1 | 405.2 |
| Cd $3d_{3/2}$ | 411.9 | 411.7 | 411.9 |
| S 2p | 161.7 | 161.4 | 162.5 |
| O 1s | 532 | 531.6 | 543.1 |
| C 1s | 284.7 | 284.6 | 284.2 |

Figure 27A:
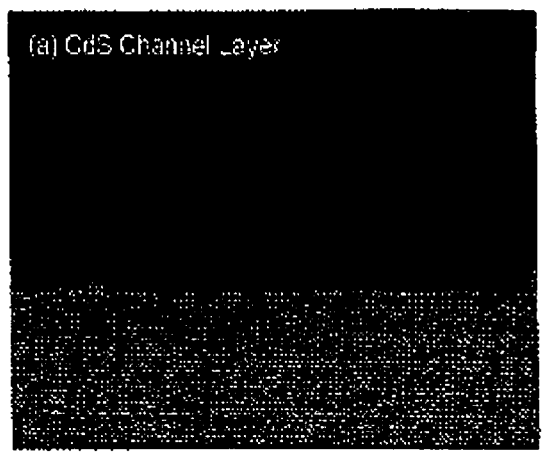
FIG. 27A is a cross sectional SEM image of a CBD CdS thin film batch deposited on an $SiO_2$/Si substrate.
Figure 27B:
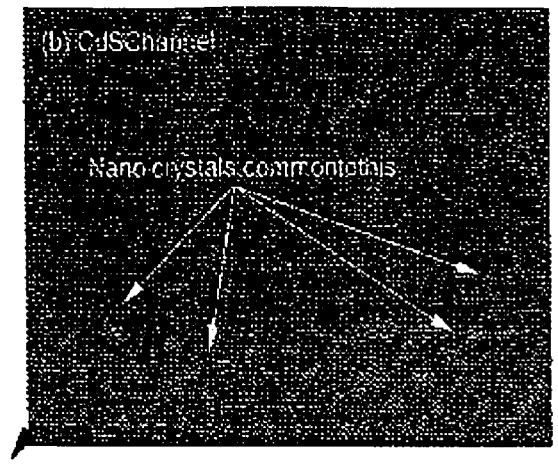
FIGS. 27B-D are plan view SEM images of a CBD CdS thin film batch deposited on an $SiO_2$/Si substrate.
Figure 27C:
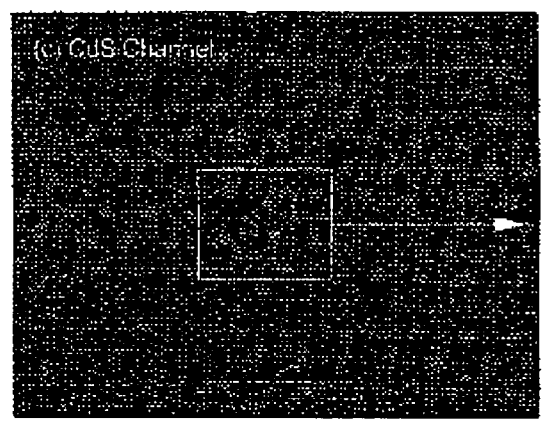
Figure 27D:

A different CBD CdS growth was performed with 0.002 M $CdCl_2$, 0.02 M $SC(NH_2)_2$, 0.02 M $NH_4Cl$ and 0.2 M $NH_4OH$ at 80° C. for further elucidation of the molecule-by-molecule and particle-by-particle growth mechanism. A cross-sectional SEM image of the resulting CBD CdS thin film deposited on an $SiO_2$/Si substrate is shown in FIG. 27A. In this condition, the majority of the batch CBD CdS thin film was formed within the compact layer growth regime, which resulted in a denser film. The series of SEM images shown in FIGS. 27B-D suggest that film growth was terminated when particle sticking growth was initiated.

Example 6

This example illustrates the effect of residence time in tailoring deposition flux using a continuous flow microreactor for CBD, such as illustrated in FIG. 2. The particular continuous flow microreactor used for this example included a microprocessor controlled peristaltic pump (Ismatec REGLO Digital), three 1.22 mm ID Tygon ST tubings (Upchurch Scientific), an interdigital micromixer, a 3" diameter stainless steel metallic plate, and a 2" diameter×0.75" thick heating hotplate with a digital temperature controller (Watlow). The standard slit interdigital micromixer (SSIMM from *Institut für Mikrotechnik Mainz*, Germany) was used for burst and uniform mixing of reactant stream A and B. It is essentially made of a stainless steel SS 316Ti housing with an inlay of thermally oxidized silicon (30 μm×100 μm channels). These mixer inlays are fabricated by an advanced silicon etching (ASE) technique.

Oxidized silicon substrates (silicon wafer coupons) measuring 15×10 mm were used for deposition studies. The coupons were cleaned according to a standard AMD (acetone, methanol, DI water) procedure then dried under a stream of nitrogen gas before being used for deposition.

Reactant streams A and B initially were heated to 80° C. (using VWR hot plate stirrer) then pumped through the Tygon ST tubings and mixed in the micromixer. Stream A comprised 24 ml of 0.0163 M $CdCl_2$, 20 ml of 0.196 M $NH_4Cl$, and 4 ml of 9.8 M $NH_4OH$. Stream B comprised 24 ml of 0.163 M thiourea and 26 ml of de-ionized water. The overall concentrations of the reactants were 0.004 M $CdCl_2$, 0.04 M $NH_4Cl$, 0.04 M thiourea and 0.4 M $NH_4OH$. The resulting solution was passed through a 10 cm Tygon ST tubing and impinged on the substrate, which was taped to a 3" diameter SS metallic plate and heated on a hotplate (2" diameter×0.75" thick SS disk from Watlow) at 80° C.

Different mixture mean residence times after passing from the micromixer were used and were controlled by changing the reactant flow rate. The specific mean residence times used were 1, 7, 70, and 280 seconds. Once the one minute deposition process was completed, the substrate was removed from the plate, washed with Millipore DI water and dried under a stream of nitrogen gas.

The surface morphology and chemical composition of CdS thin films were characterized by scanning electron microscopy (SEM) and energy dispersive X-ray (EDX) (FEI Sirion XL30) at 5 KV and 20 KV, respectively. The nanoparticles generated from homogeneous reaction within the microchannel were analyzed by transmission electron microscope. To prepare transmission electron microscopy (TEM) samples for continuous flow microreactor, copper grids with thin lacey carbon films (Ted Pella, Inc.) were placed on top of a filter paper inserted inside a funnel with a small hole first pinched underneath the grid. One drop of the hot solution collected from the reactor at the specific residence times was dropped on the TEM grid and dried immediately by vacuum to prevent further chemical reaction from the remaining solution. Electron micrographs of CdS thin-films deposited on TEM grids were characterized by TEM, (FEI Tecnai F20) at 200 KV.

Figure 34:
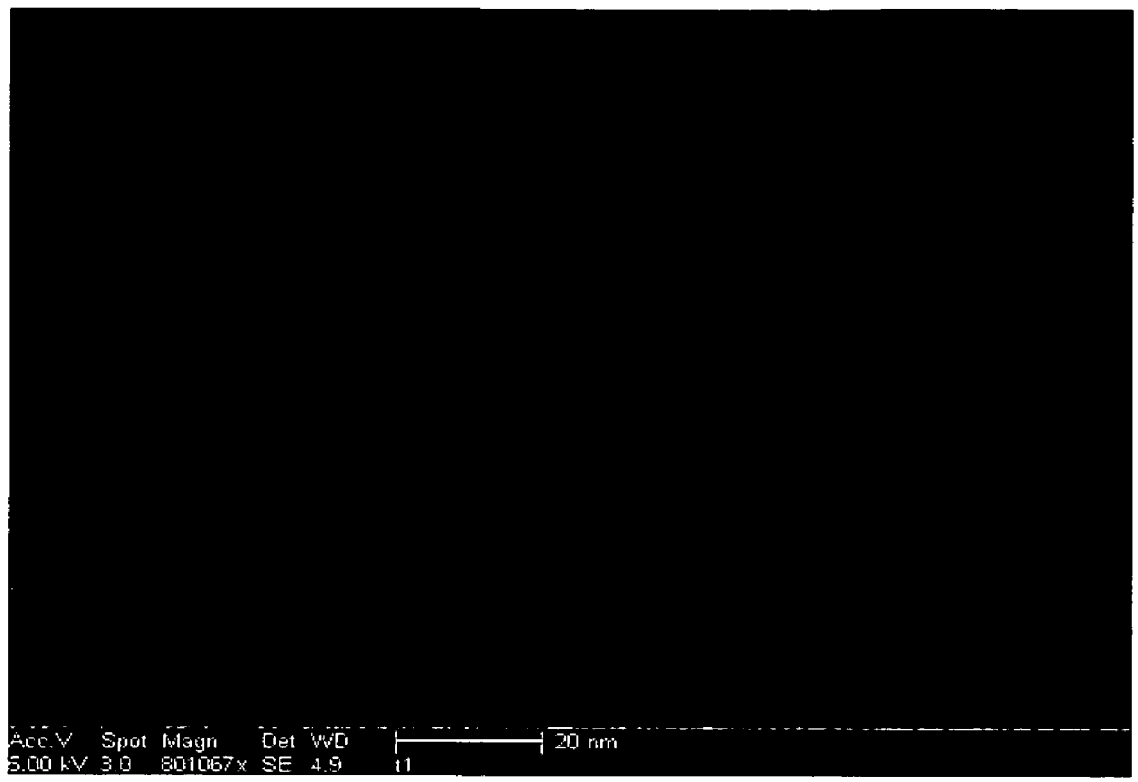
FIG. 34 is an SEM image of a CdS film deposited using a continuous flow microreactor for one minute using a mean residence time of 1 second.

Extremely smooth and uniform CdS thin films were observed when CBD flux of 1 second residence time was used for deposition (see FIG. 34.). Smooth, uniform films of this quality are difficult, if not impossible, to achieve using a conventional batch CBD process. Using this nearly particle-free flux, the molecule-by-molecule heterogeneous growth mechanism was promoted, which prevents particle-by-particle growth. As a result, unwanted deposition on vessel walls and the homogeneous CdS particle formation for the CBD process were minimized.

Figure 35:
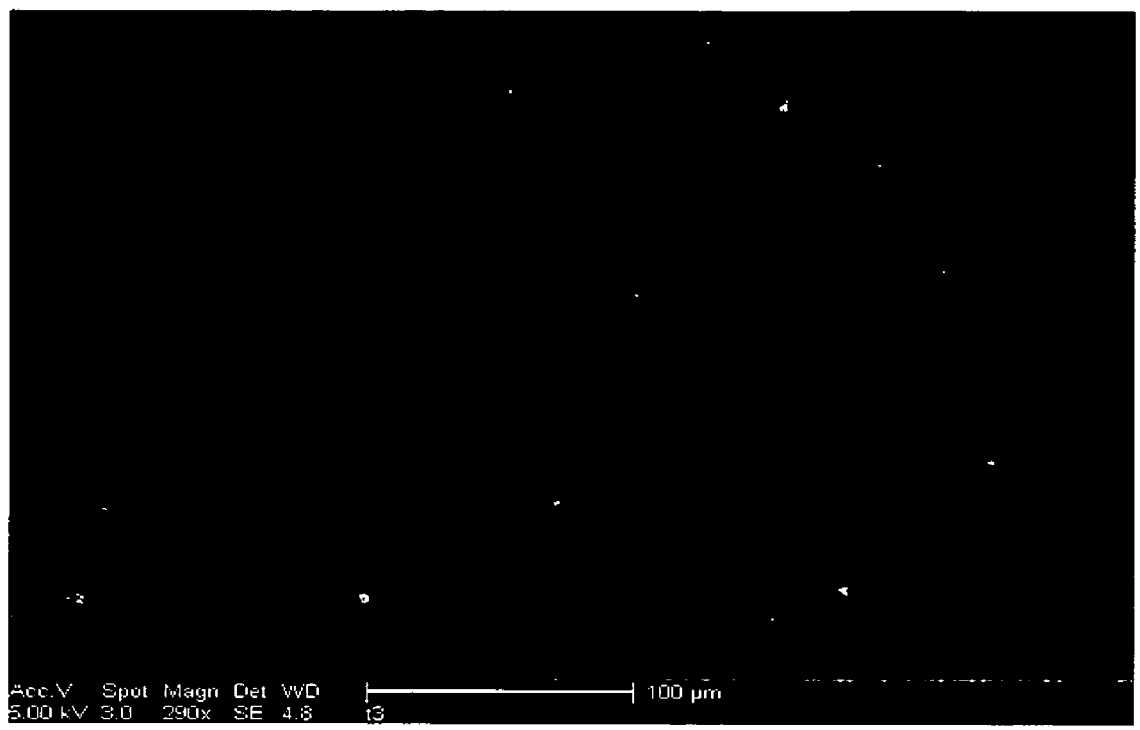
FIG. 35 is an SEM image of a CdS film deposited using a continuous flow microreactor for one minute using a mean residence time of 7 seconds.
Figure 36:
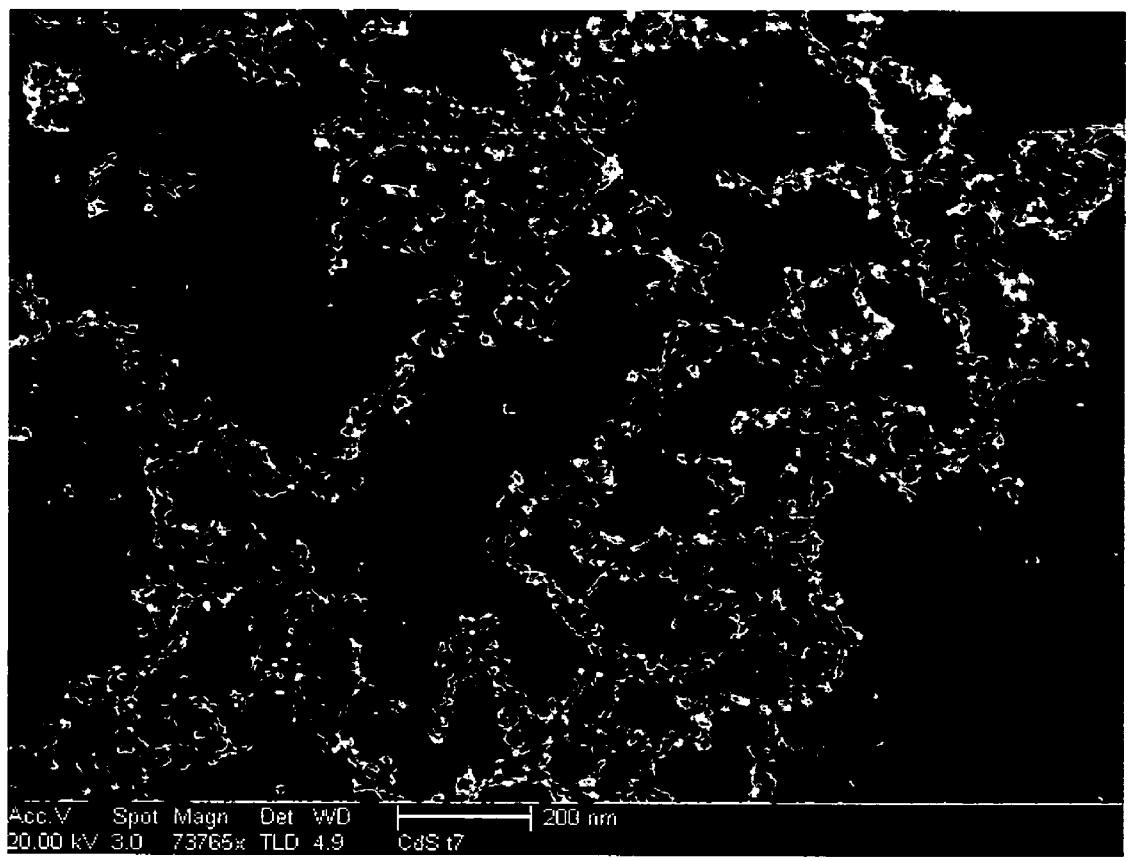
FIG. 36 is an SEM image of a CdS film deposited using a continuous flow microreactor for one minute using a mean residence time of 280 seconds.

In addition to the uniform thin film, some CdS nanoparticles could be found when a CBD flux of 7 seconds residence time was used for deposition (see FIG. 35). The nanoparticles were further aggregated and connected together when using a CBD flux of 280 seconds residence for deposition (see FIG. 36).

Figure 37:
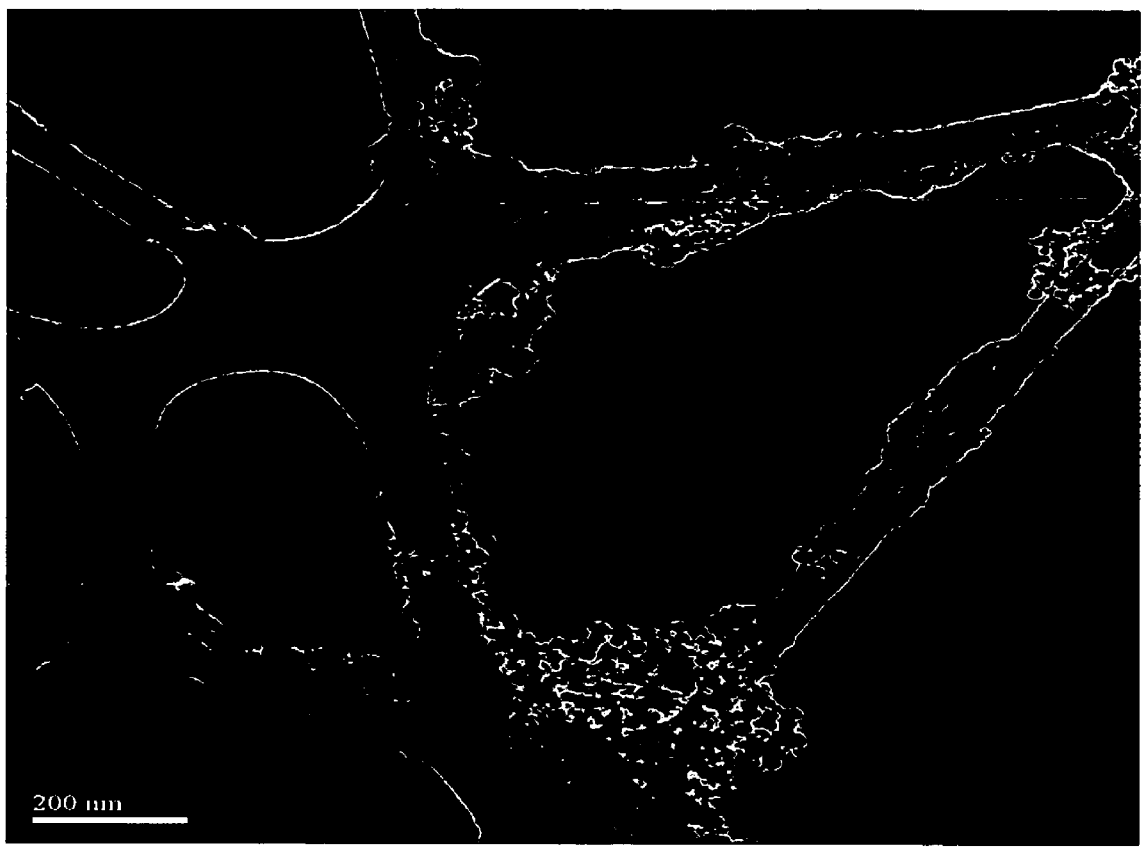
FIG. 37 is a TEM micrograph of CdS nanoparticles generated from a homogeneous reaction from a continuous flow microreactor with a 1 second residence time.
Figure 38:
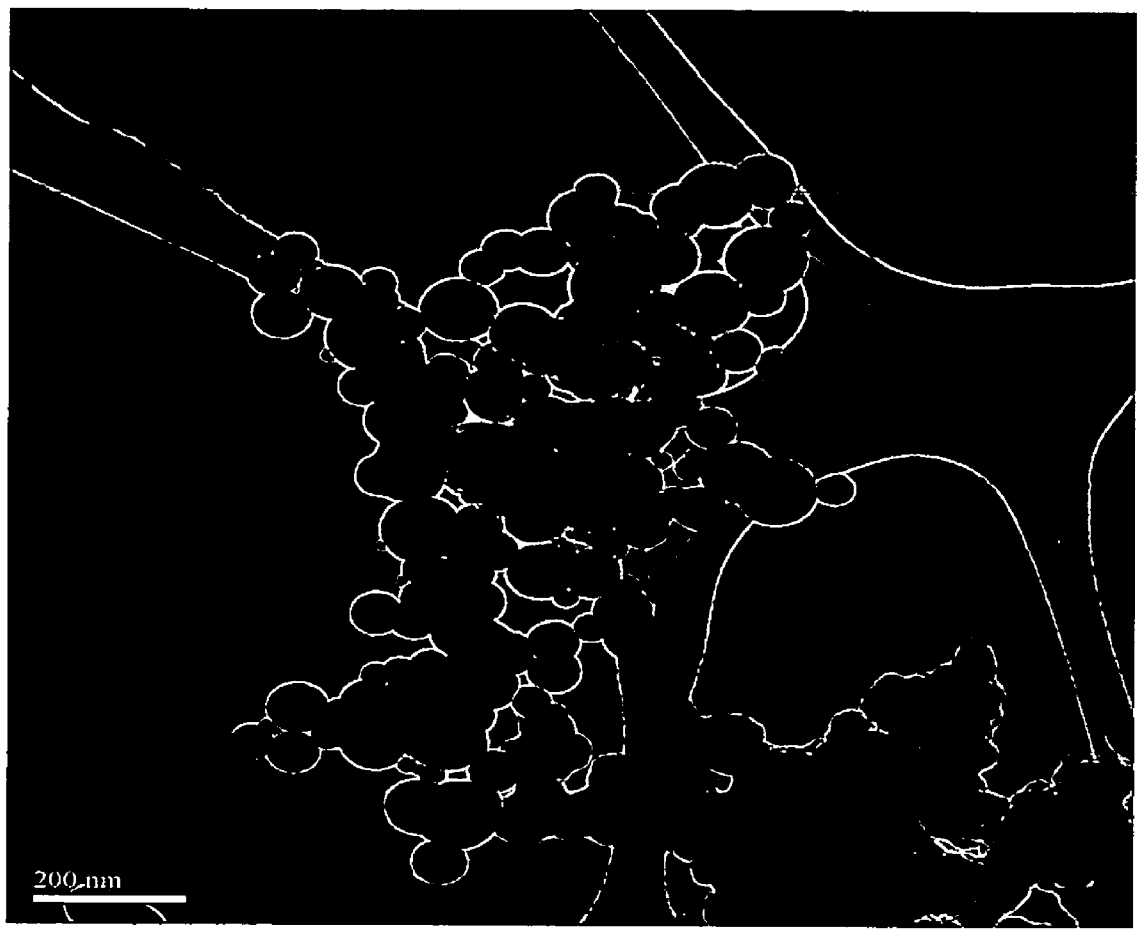
FIG. 38 is a TEM micrograph of CdS nanoparticles generated from a homogeneous reaction from a continuous flow microreactor with a 7 seconds residence time.
Figure 39:
FIG. 39 is a TEM micrograph of CdS nanoparticles generated from a homogeneous reaction from a continuous flow microreactor with a 280 seconds residence time.
Figure 40:
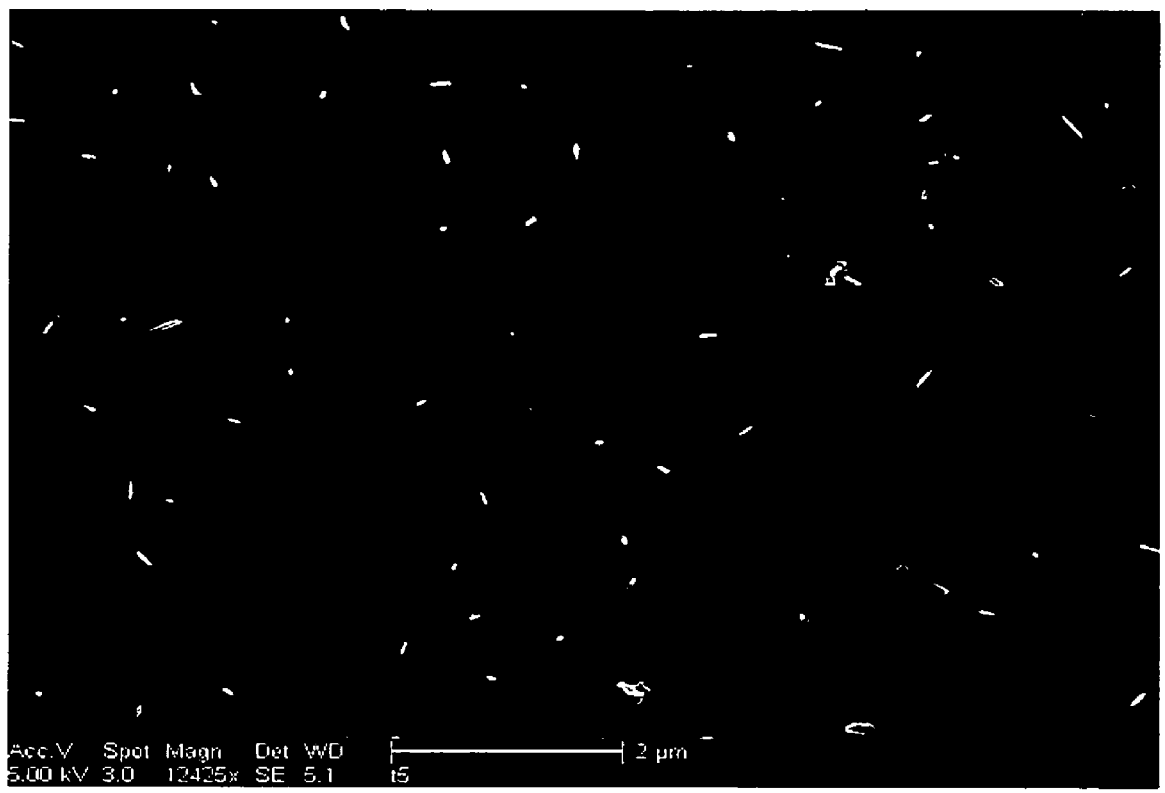
FIG. 40 is a TEM micrograph of CdS nanoparticles generated from homogeneous reaction using a continuous flow microreactor with a residence time of 1 second.

In order to further study and elucidate the formation of homogeneous particle growth that could also be deposited on the heterogeneous thin film surface, TEM characterizations were performed. FIG. 37 shows that some very small CdS clusters and nanoparticles could be found from CBD flux of 1 second residence time. Spherical nanoparticles having diameters in the range of from about 30 to about 100 nm could be clearly observed from a CBD flux of 7 seconds residence time (see FIG. 38). CdS nanoparticles start to aggregate and agglomerate together when a longer residence time (e.g. 280 seconds) was applied (see FIG. 39).

Figure 41:
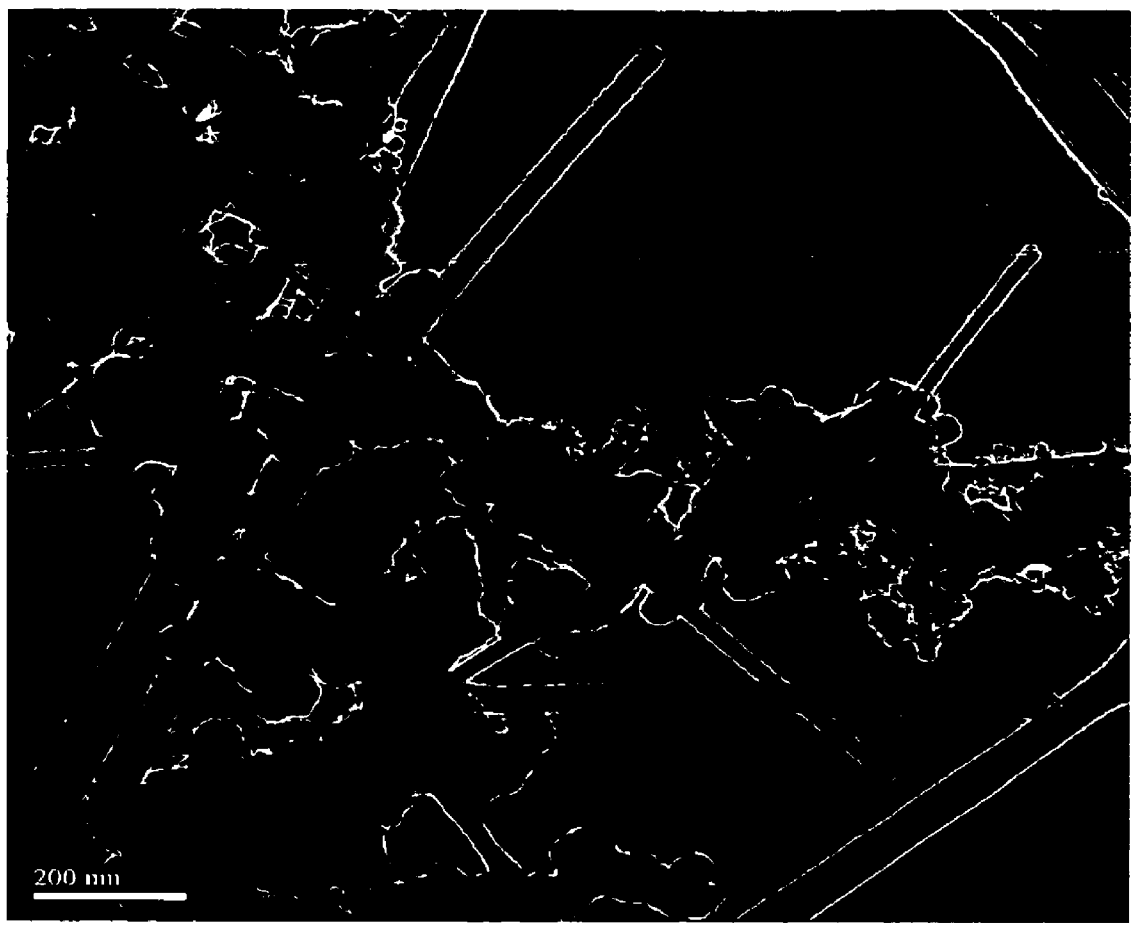
FIG. 41 is a TEM micrograph of CdS nanoparticles generated from homogeneous reaction using a continuous flow microreactor with a residence time of 7 seconds.
Figure 42:
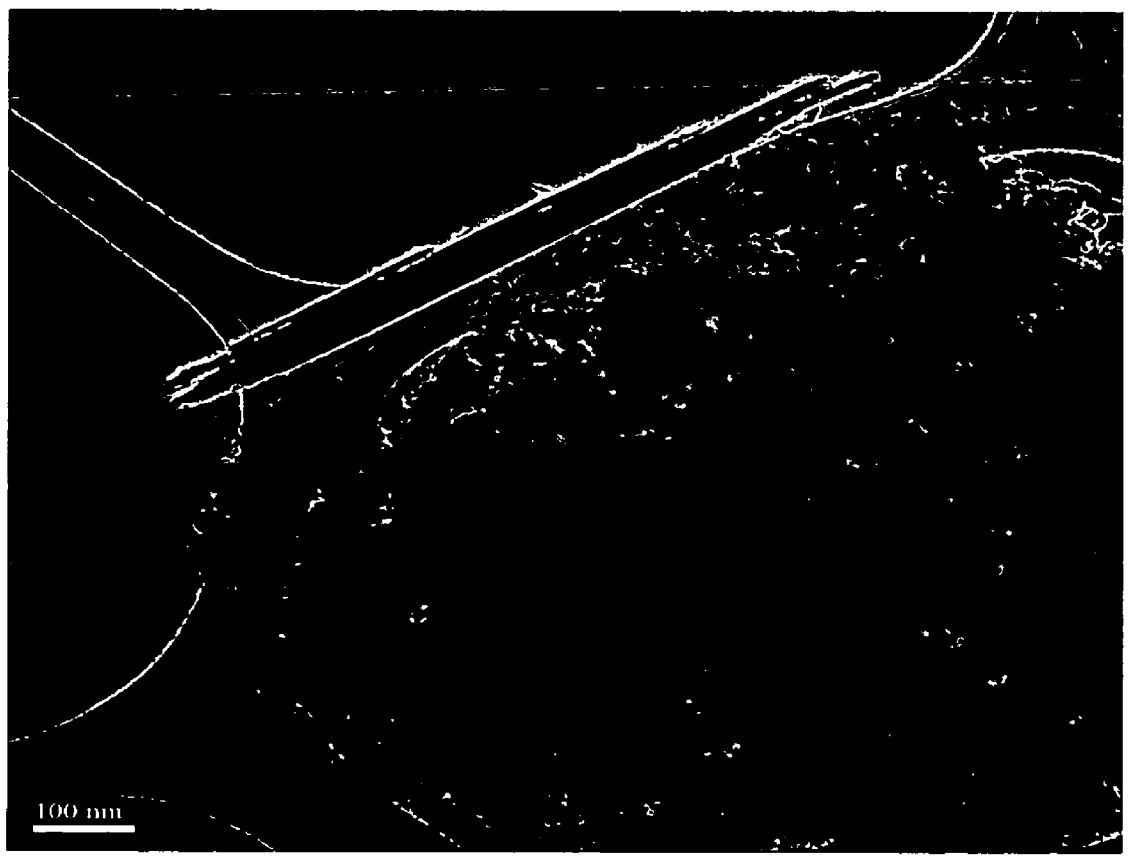
FIG. 42 is a TEM micrograph of CdS nanoparticles generated from homogeneous reaction using a continuous flow microreactor with a residence time of 280 seconds.

In some areas, CdS nanorods were clearly observed from the SEM micrograph having a diameter in a range of from about 50 to about 70 nm. The corresponding EDX spectrum confirmed the formation of CdS particles. The formation of CdS nanorods perhaps contributed to anisotropic growth from spherical CdS nanoparticles in the Tygon ST tubing with increasing residence time (growth time). CdS nanorods or nanowires also could be observed from the TEM results. For example, CdS nanorods having a diameter in a range of from about 30 to about 70 nm, along with nanoparticles, were found. See, FIG. 41. In addition, CdS nanorod bundle structures could be formed at longer residence times (e.g. 140 seconds, FIG. 42).

The present invention has been described with reference to exemplary embodiments. The scope of the present invention is not limited to these exemplary features. For example, certain features of the invention have been exemplified by reference to the formation of CdS particles. A person of ordinary skill in the art will appreciate that other materials can be formed using disclosed embodiments of the present method and system.

I claim:

1. A process for forming a film on a substrate by chemical deposition, comprising: providing a first reactant; providing at least a second reactant;
   flowing the first and second reactants to a micromixer to mix the first and second reactants to form a mixture; heating the mixture for a period of time sufficient to form reaction flux useful for forming a chemical deposition material capable of reacting with a substrate surface; controlling residence time of the mixture in the micromixer to substantially avoid produce a substantially particle-free flux formation;
   heating a substrate to a temperature less than 90° C. to provide a heated substrate; and
   depositing the deposition material substantially continuously on the heated substrate using a microchannel applicator without an intermediate isolation step and prior to substantial formation of particles, where the continuously flowing solution removes byproduct formed by mixing the reactants; and allowing the deposition material to form a device-quality continuous film on the substrate by a chemical deposition process without heating to a temperature required for annealing, where the first and second reactants are selected to form Au, Ag, Cu, Co, Cr, Ge, Ni, Pt, Pd, Rh, Se, Si, Ru, Ag2S, Ag2Se, AgO, Ag2O, Al2O3, As2S3, BaO, Bi2S3, Bi2Se3, CdO, CdS, CdSe, CdSnO, CdTe, CdZnS, CeO2, CoS, CoSe, CoO, CrO2, CuBiS2, CuGaSe2, Cu(In,Ga)Se2, CuInSe2, CuInS2, Cu2.xS, Cu2, xSe, Cu2O, FeO(OH), Fe2O3, Fe3O4, GaAs, GaN, Ga2O3, GaP, Ge, GeO2, HfO2, HgS, HgSe, InGaAs, InAs, In2O3, InP, In2S3, In2Se3, La2O3, MgO, MnS, MnO2, MOO2, MoS2, MoSe2, NbO2, NiS, NiSe, NiO, PbHgS, PbS, PbSe, PbTe, PbO2, ReO3, RhO2, RuO2, Sb2S3, Sb2Se3, SiGe, SiO2, SnS, SnS2, SnSe, SnO2, Sb2S3, TiO2, T1S, T1Se, T12O3, VO2, WO2, Y2O3, ZnO, ZnS, ZnSe, ZrO2, or combinations thereof.

2. The process according to claim 1 where the deposition material is CdS.

3. The process according to claim 2 where the first reactant comprises a cadmium halide.

4. The process according to claim 2 where the second reactant comprises thiourea.

5. The process according to claim 1 where the deposition material is CdS, ZnO, InO$_x$ or combinations thereof.

6. The process according to claim 1 where the first reactant, the second reactant, or both further comprise a complexing agent.

7. The process according to claim 6 where the complexing agent is a nitrogen-bearing compound.

8. The process according to claim 6 where the complexing agent is ammonia, an aliphatic amine, an aliphatic amide, or combinations thereof.

9. The process according to claim 6 where the complexing agent is ammonia, triethanolamine, ethanolamine, diethylenetriamine, ethylenediaminetetracetate, hydrazine, nitrilotriacetate, triethylenetriamine or combinations thereof.

10. The process according to claim 1 where the film is an epitaxial nanostructured film, a nanocrystalline film, an epitaxial film comprising embedded nanocrystals, a superlattice film, a composition gradient film, a composite film comprising core-shell nanoparticles, or combinations thereof.

11. The process according to claim 1 where the substrate is flexible.

12. The process according to claim 1 useful for making an electronic device, the process comprising forming an electronic device comprising the deposition material deposited on the substrate.

13. The process according to claim 12 where the device is a transistor.

14. The process according to claim 12 where the transistor is a flexible transistor.

15. The process according to claim 12 where the device is a solar cell, a flexible solar cell, a light emitting diode, a flexible light emitting diode, a detector, a flexible detector, a sensor, a flexible sensor, a switch or a flexible switch.

16. The process according to claim 13 where the transistor is a CdS MISFET.

17. The process according to claim 1 where the mixer is a micromixer.

18. The process according to claim 1 where the substrate is a rotating substrate, a roll-to-roll substrate, or a flow cell.

19. A method for forming an electronic device by a chemical deposition process, comprising:
   providing at least a first reactant and at least a second reactant, where the first and second reactants are selected to form Au, Ag, Cu, Co, Cr, Ge, Ni, Pt, Pd, Rh, Se, Si, Ru, $Ag_2S$, $Ag_2Se$, AgO, $Ag_2O$, $Al_2O_3$, $As_2S_3$, BaO, $Bi_2S_3$, $Bi_2Se_3$, CdO, CdS, CdSe, CdSnO, CdTe, CdZnS, $CeO_2$, CoS, CoSe, CoO, $CrO_2$, $CuBiS_2$, $CuGaSe_2$, $Cu(In,Ga)Se_2$, $CuInSe_2$, $CuInS_2$, $Cu_{2-x}S$, $Cu_{2-x}Se$, $Cu_2O$, FeO(OH), $Fe_2O_3$, $Fe_3O_4$, GaAs, GaN, $Ga_2O_3$, GaP, Ge, $GeO_2$, $HfO_2$, HgS, HgSe, InGaAs, InAs, $In_2O_3$, InP, $In_2S_3$, $In_2Se_3$, $La_2O_3$, MgO, MnS, $MnO_2$, $MoO_2$, $MoS_2$, $MoSe_2$, $NbO_2$, NiS, NiSe, NiO, PbHgS, PbS, PbSe, PbTe, $PbO_2$, $ReO_3$, $RhO_2$, $RuO_2$, $Sb_2S_3$, $Sb_2Se_3$, SiGe, $SiO_2$, SnS, $SnS_2$, SnSe, $SnO_2$, $Sb_2S_3$, $TiO_2$, TlS, TlSe, $Tl_2O_3$, $VO_2$, $WO_2$, $Y_2O_3$, ZnO, ZnS, ZnSe, $ZrO_2$, or combinations thereof;
   flowing the first and second reactants to a micromixer to mix the first and second reactants to form a mixture;
   heating the mixture for a period of time sufficient to form a reaction flux useful for forming a deposition material;
   controlling residence time of the mixture in the micromixer to produce a substantially particle-free flux;
   heating a substrate to a temperature less than 90° C. to provide a heated substrate;
   depositing the deposition material substantially continuously on the heated substrate without an intermediate isolation step using a microchannel applicator;
   allowing the deposition material to form a device-quality film on the substrate without heating to a temperature required for annealing, where the film is an epitaxial nanostructured film, a nanocrystalline film, an epitaxial film comprising embedded nanocrystals, a superlattice film, a composition gradient film, a composite film comprising core-shell nanoparticles, or combinations thereof; and
   forming an electronic device comprising the substrate and the film, where the device is a transistor, a solar cell, a light emitting diode, a detector, a sensor, or a switch.

20. The process according to claim 19 where the device is flexible.

21. The process according to claim 19 where the mixer is a micromixer.

* * * * *

UNITED STATES PATENT AND TRADEMARK OFFICE
CERTIFICATE OF CORRECTION

PATENT NO.         : 7,846,489 B2                                  Page 1 of 1
APPLICATION NO.    : 11/490966
DATED              : December 7, 2010
INVENTOR(S)        : Chih-hung Chang It is certified that error appears in the above-identified patent and that said Letters Patent is hereby corrected as shown below:

In the Specification:

Please replace the heading and paragraph beginning at column 1, line 11, with the following amended heading and paragraph:

ACKNOWLEDGEMENT OF GOVERNMENT SUPPORT
This invention was made with government support under grant No. CTS-0348723 awarded by the National Science Foundation. The government has certain rights in the invention.

Signed and Sealed this
First Day of March, 2011

David J. Kappos
*Director of the United States Patent and Trademark Office*